(12) United States Patent
Ahn et al.

(10) Patent No.: US 10,412,808 B2
(45) Date of Patent: Sep. 10, 2019

(54) LIGHT EMITTING MODULE AND LIGHTING DEVICE HAVING SAME

(71) Applicant: LG INNOTEK CO., LTD., Seoul (KR)

(72) Inventors: Young Joo Ahn, Seoul (KR); Do Yub Kim, Seoul (KR); Eon Ho Son, Seoul (KR); Mi Na Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 11 days.

(21) Appl. No.: 15/557,042

(22) PCT Filed: Mar. 9, 2016

(86) PCT No.: PCT/KR2016/002365
§ 371 (c)(1),
(2) Date: Sep. 8, 2017

(87) PCT Pub. No.: WO2016/144103
PCT Pub. Date: Sep. 15, 2016

(65) Prior Publication Data
US 2018/0063916 A1     Mar. 1, 2018

(30) Foreign Application Priority Data

Mar. 11, 2015  (KR) ........................ 10-2015-0033544

(51) Int. Cl.
*H05B 33/08* (2006.01)
*H05B 37/02* (2006.01)
(Continued)

(52) U.S. Cl.
CPC ........... *H05B 33/0869* (2013.01); *F21K 9/68* (2016.08); *F21V 3/00* (2013.01); *F21V 19/0015* (2013.01);
(Continued)

(58) Field of Classification Search
CPC ............ H05B 33/0869; H05B 33/0851; H05B 33/0848; H05B 37/0227; H05B 37/02;
(Continued)

(56) References Cited

U.S. PATENT DOCUMENTS

2007/0080364 A1\* 4/2007 Hsiung ............... H01L 25/0753
257/100
2008/0136334 A1  6/2008 Robinson et al.
(Continued)

FOREIGN PATENT DOCUMENTS

CN    101558686 A    10/2009
CN    102144430 A    8/2011
(Continued)

*Primary Examiner* — Dedei K Hammond
(74) *Attorney, Agent, or Firm* — Birch, Stewart, Kolasch & Birch, LLP

(57) ABSTRACT

A lighting apparatus according to an embodiment comprises: a circuit board; and a plurality of light emitting modules having first to third light source units for emitting different colors on the circuit board; a control unit for providing a current control signal for controlling a current of each of the first to third light source units; a driver for controlling currents of the first to third light source units with a current control signal of the control unit, and a memory unit for storing luminous flux deviation data of the first to third light source units of each of the plurality of light emitting modules, wherein the first light source unit includes a plurality of first light emitting devices for emitting red light, and the second light source unit includes a plurality of second light emitting devices for emitting green light, and the third light source unit includes a plurality of third light emitting devices for emitting blue light, and the control unit controls currents of the first, second, and third light source units of the plurality of light emitting modules, respectively, according to an intensity value of an input current corresponding to the luminous flux deviation data.

17 Claims, 23 Drawing Sheets

(51) Int. Cl.
*H05K 1/18* (2006.01)
*F21V 29/76* (2015.01)
*F21K 9/68* (2016.01)
*F21V 3/00* (2015.01)
*F21V 19/00* (2006.01)
*F21V 7/04* (2006.01)
*F21V 29/74* (2015.01)
*F21V 29/89* (2015.01)
*F21Y 115/10* (2016.01)
*F21Y 113/13* (2016.01)
*H05K 1/02* (2006.01)
*F21Y 105/10* (2016.01)

(52) U.S. Cl.
CPC ......... *F21V 29/76* (2015.01); *H05B 33/0803* (2013.01); *H05B 33/0827* (2013.01); *H05B 33/0851* (2013.01); *H05B 33/0866* (2013.01); *H05K 1/181* (2013.01); *F21V 7/04* (2013.01); *F21V 29/74* (2015.01); *F21V 29/89* (2015.01); *F21Y 2105/10* (2016.08); *F21Y 2113/13* (2016.08); *F21Y 2115/10* (2016.08); *H01L 2224/14* (2013.01); *H01L 2224/48091* (2013.01); *H01L 2224/73265* (2013.01); *H05K 1/0203* (2013.01); *H05K 2201/10106* (2013.01); *H05K 2201/10151* (2013.01); *Y02P 70/611* (2015.11)

(58) Field of Classification Search
CPC .............. G09G 3/3413; G09G 3/3406; G09G 2360/145; Y02B 20/46
USPC ........ 315/151, 158, 156, 307, 291; 250/205; 345/102; 362/231, 276
See application file for complete search history.

(56) References Cited

U.S. PATENT DOCUMENTS

| | | | |
|---|---|---|---|
| 2009/0219306 A1* | 9/2009 | Oh | G09G 3/3225 345/690 |
| 2011/0084615 A1 | 4/2011 | Welten | |
| 2011/0156596 A1 | 6/2011 | Salsbury | |
| 2011/0249431 A1 | 10/2011 | Tanaka | |
| 2013/0077299 A1* | 3/2013 | Hussell | H05B 37/02 362/231 |
| 2014/0225517 A1* | 8/2014 | Nam | H05B 33/0821 315/185 R |
| 2016/0153622 A1* | 6/2016 | Yu | H05B 33/0803 362/231 |
| 2016/0302282 A1* | 10/2016 | Ooghe | G09G 3/3413 |
| 2017/0345866 A1* | 11/2017 | Joo | H01L 33/60 |

FOREIGN PATENT DOCUMENTS

| | | |
|---|---|---|
| CN | 102223745 A | 10/2011 |
| CN | 104081112 A | 10/2014 |
| KR | 10-2009-0088447 A | 8/2009 |
| KR | 10-2012-0050751 A | 5/2012 |
| KR | 10-2012-0050781 A | 5/2012 |
| KR | 10-2013-0027740 A | 3/2013 |
| KR | 10-2014-0097284 A | 8/2014 |
| KR | 10-2014-0101608 A | 8/2014 |
| KR | 10-2015-0011191 A | 1/2015 |

* cited by examiner

[FIG. 1]
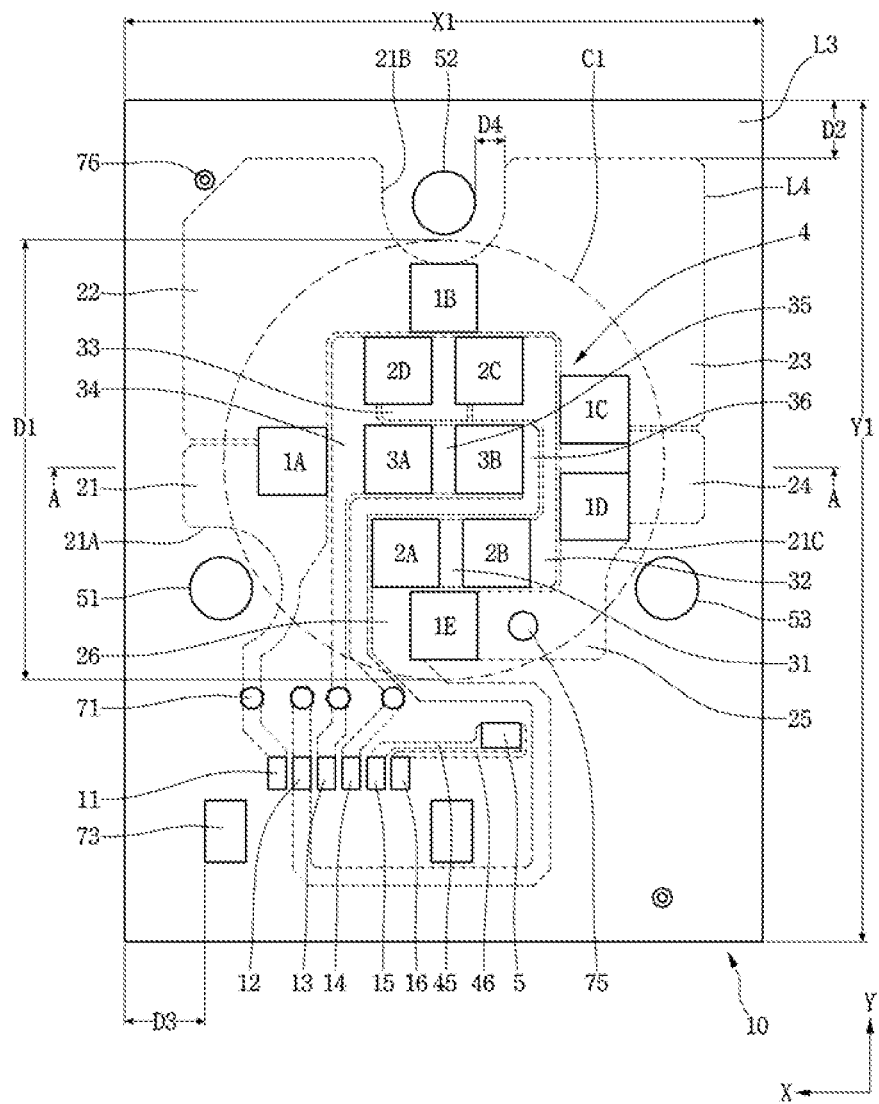

【FIG. 2】
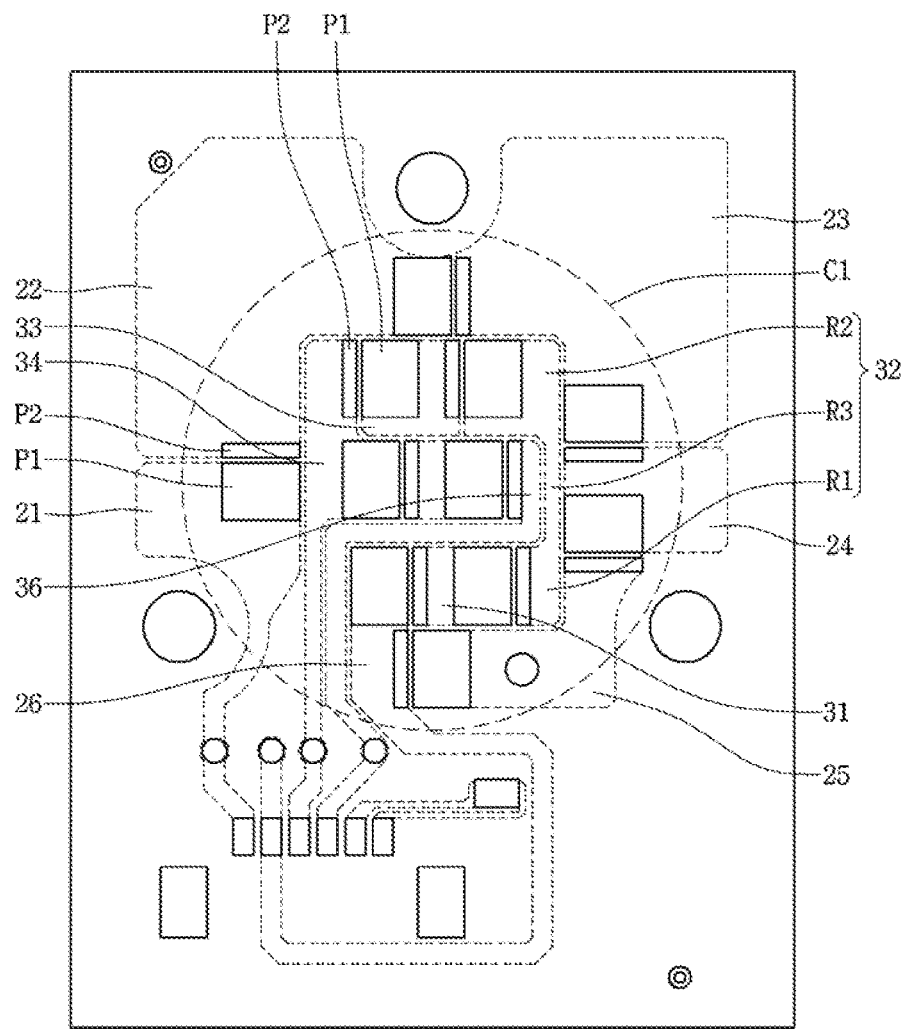
【FIG. 3】
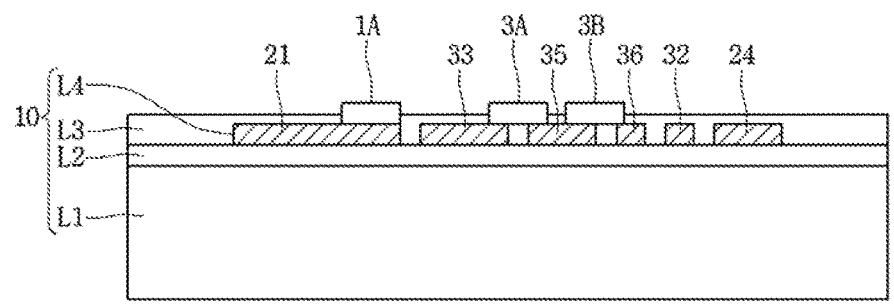

[FIG. 4]
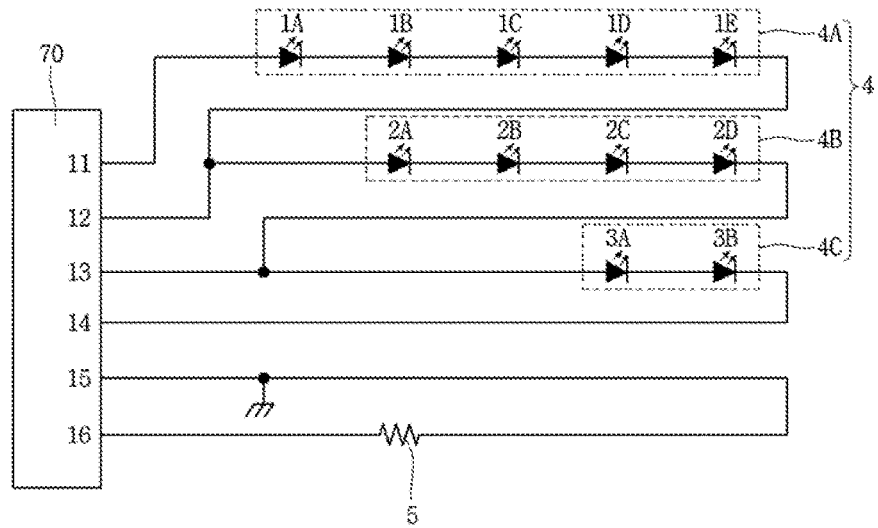
[FIG. 5]
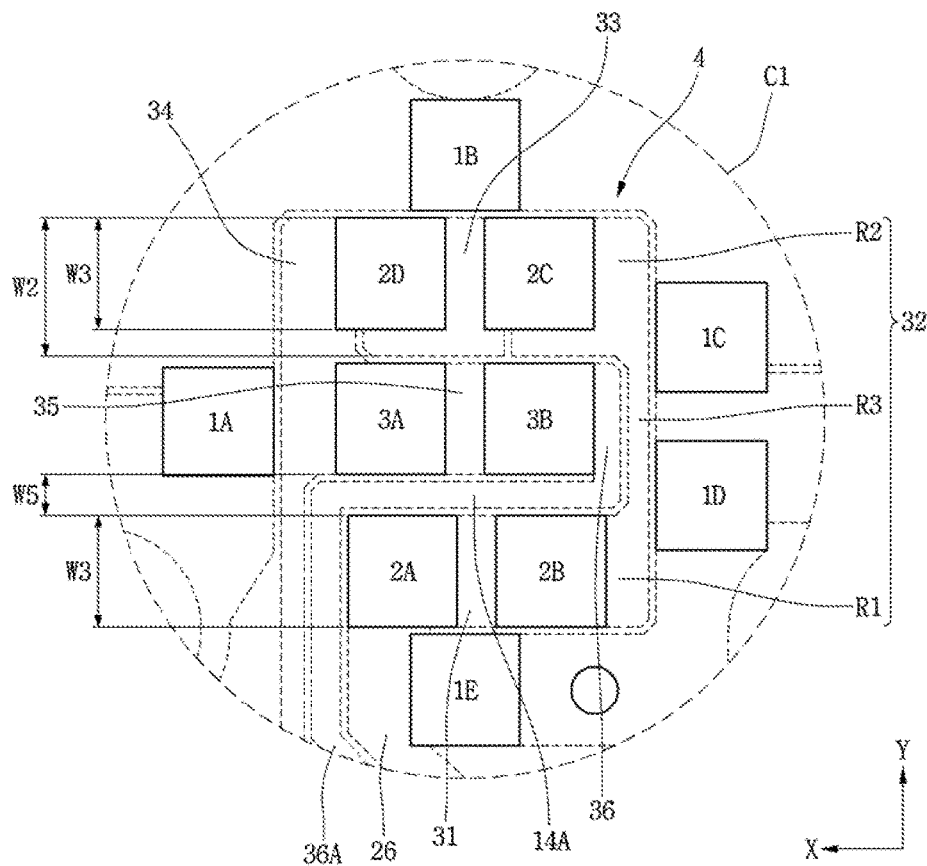

[FIG. 6]
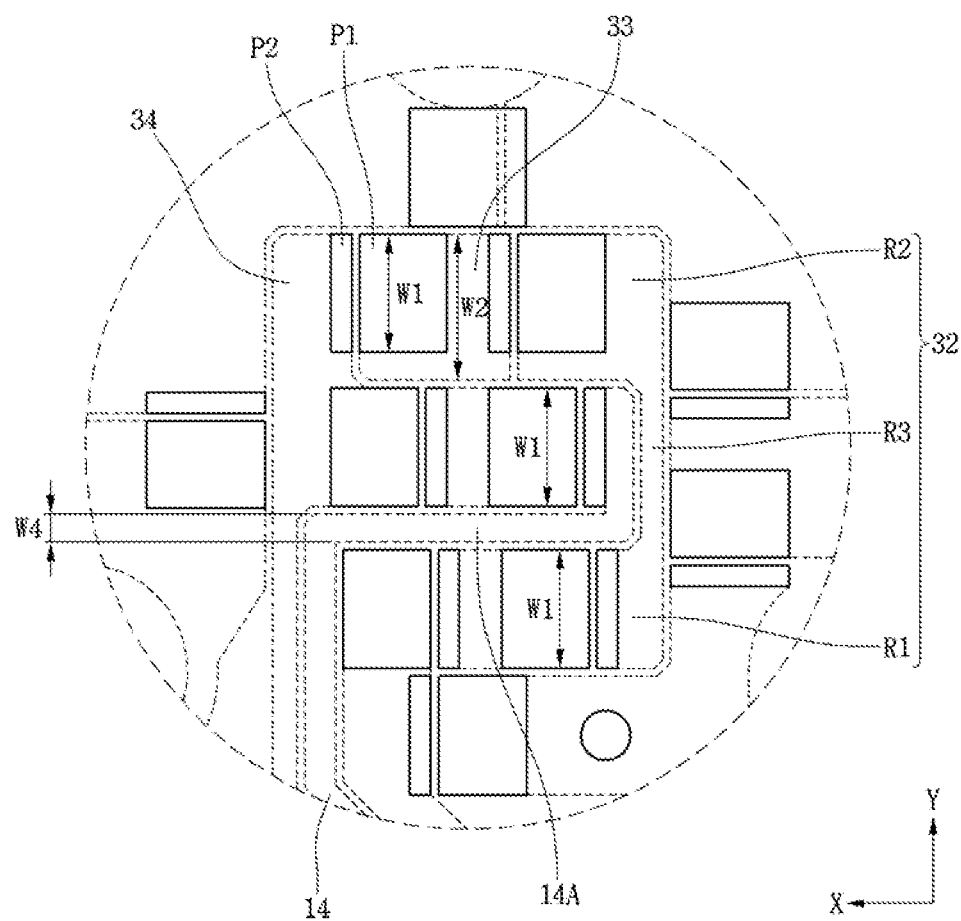

[FIG. 7]
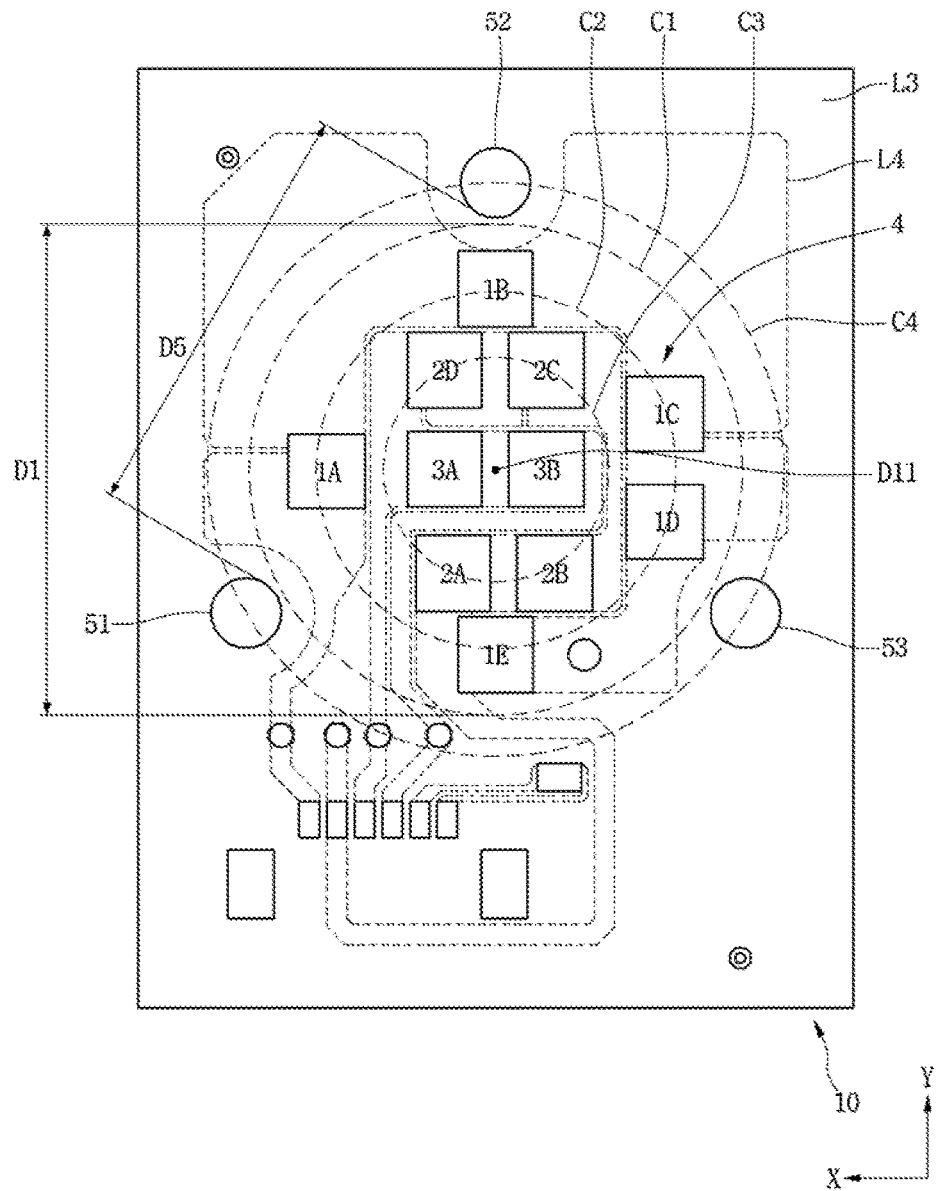

[FIG. 8]
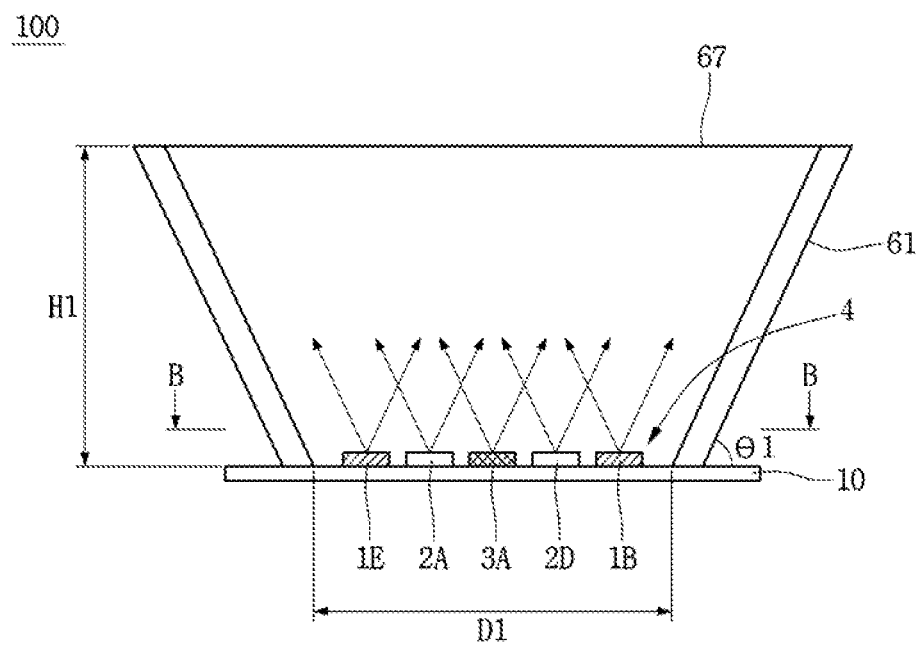

[FIG. 9]
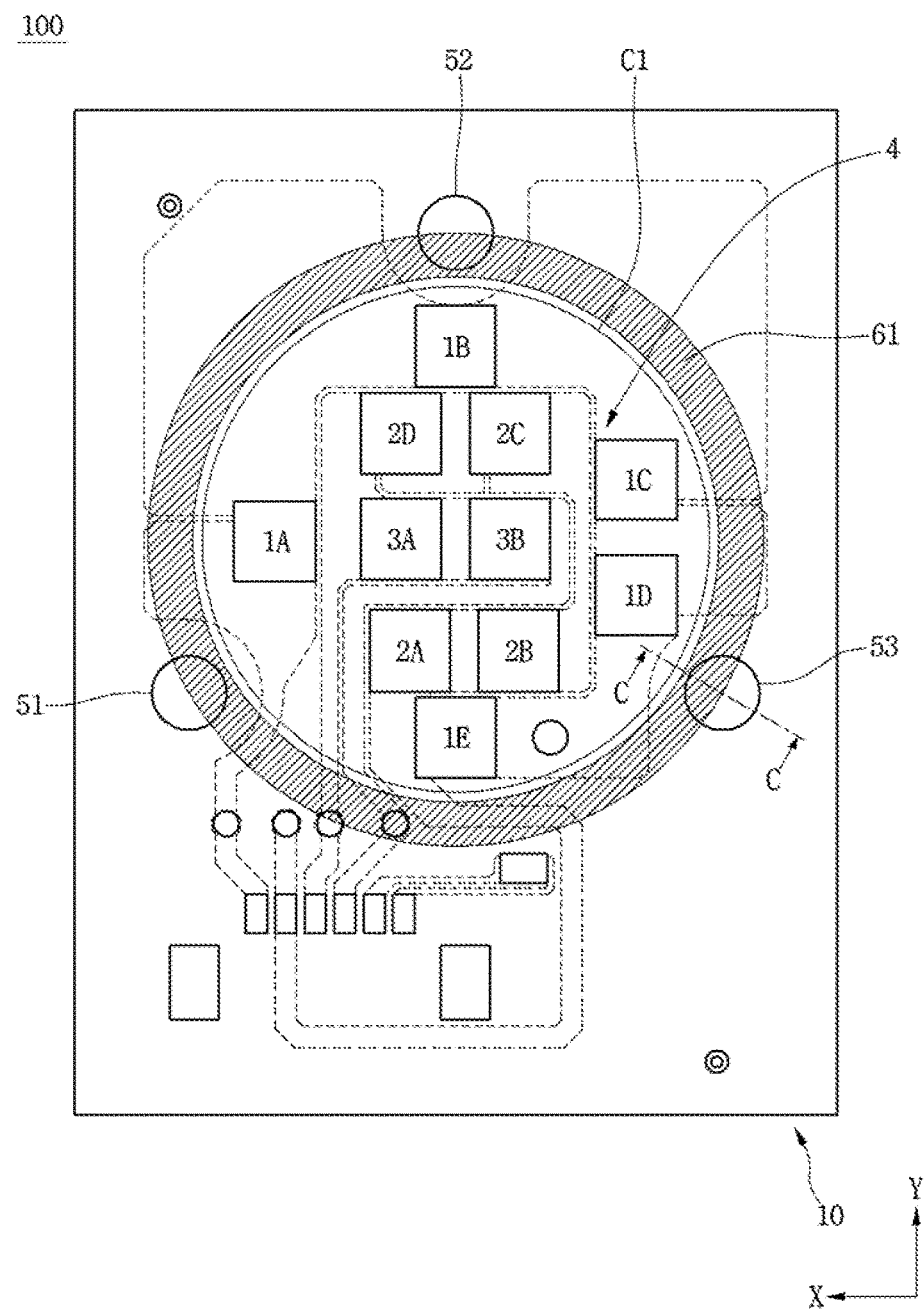

[FIG. 10]
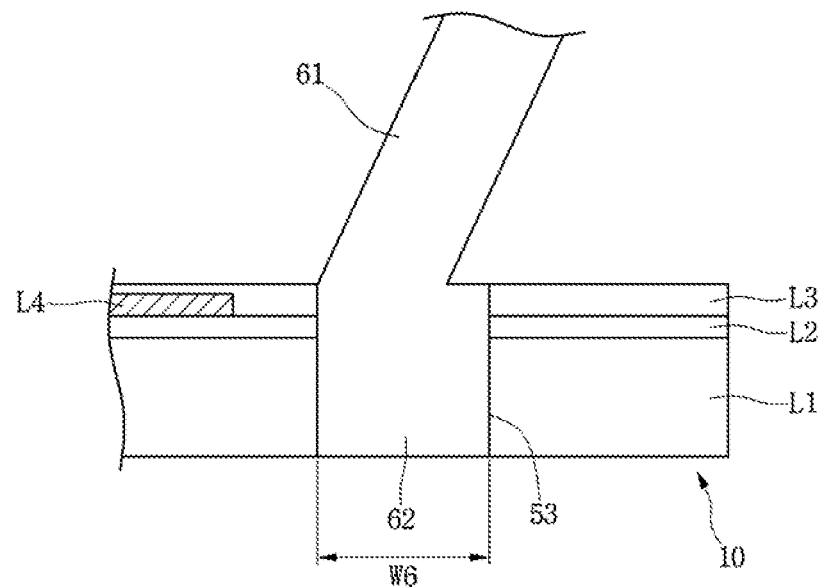
[FIG. 11]
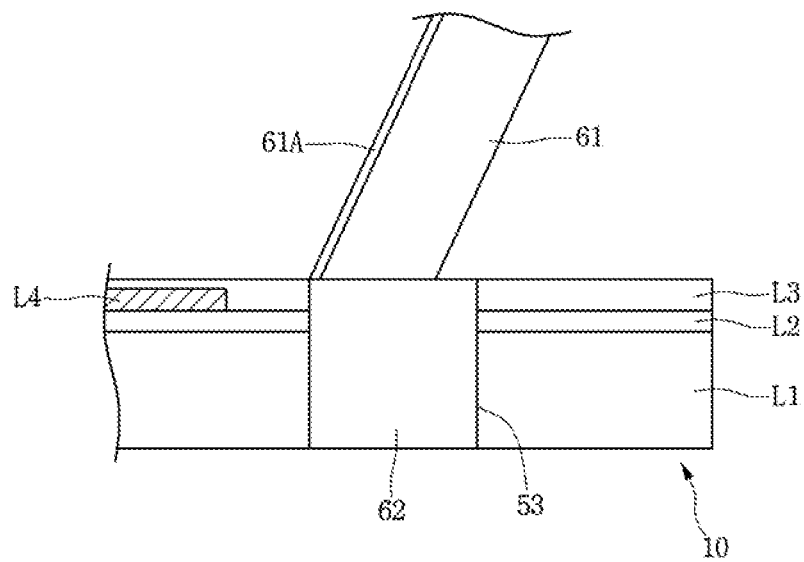

[FIG. 12]
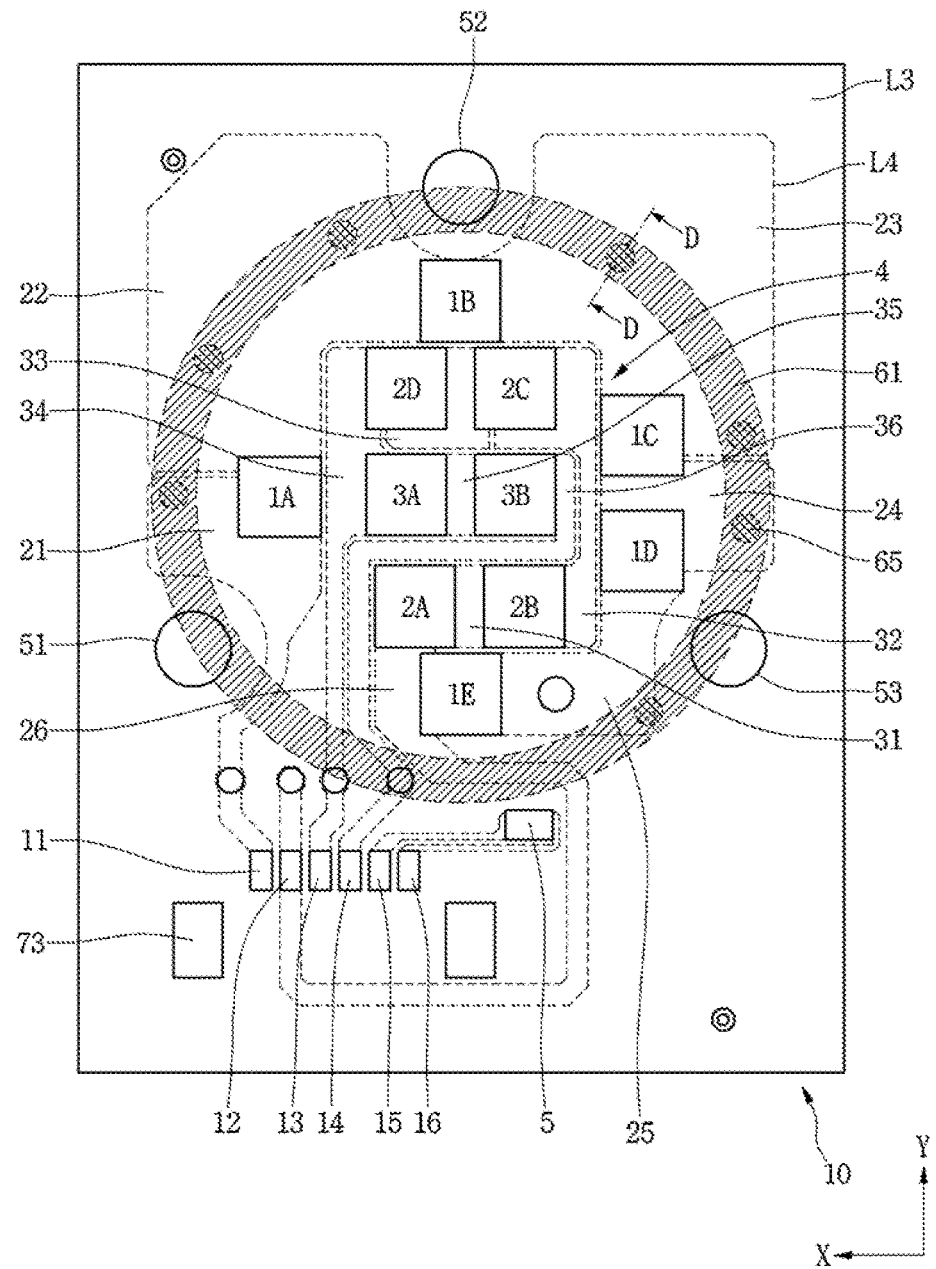

[FIG. 13]
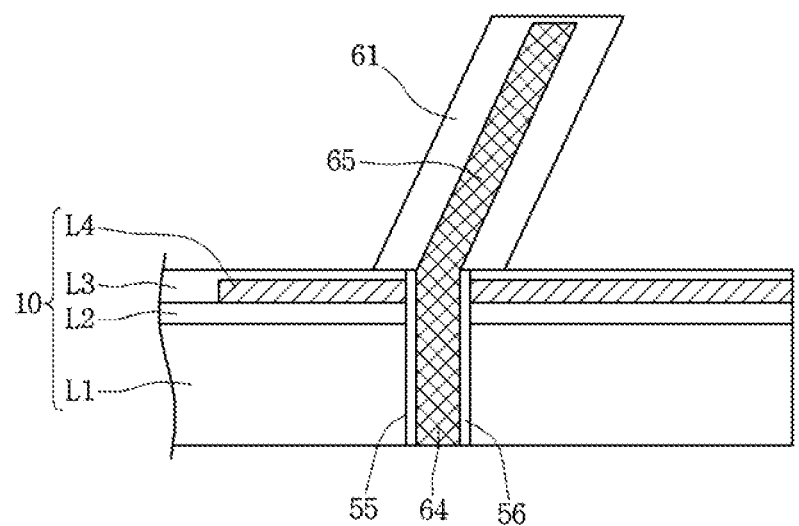
[FIG. 14]
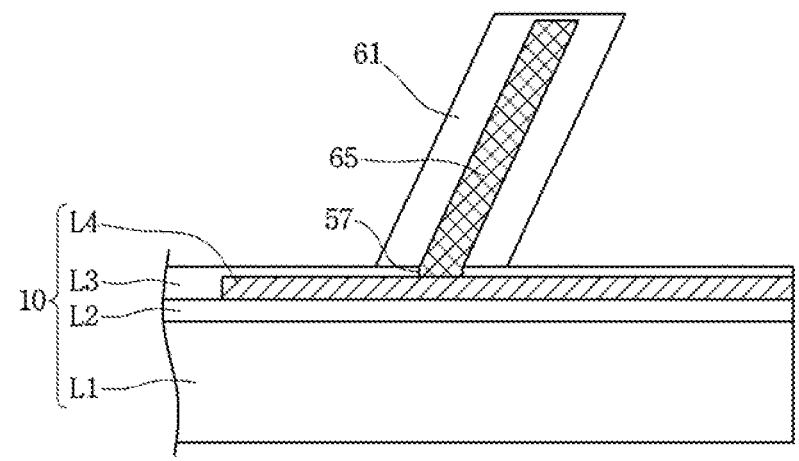

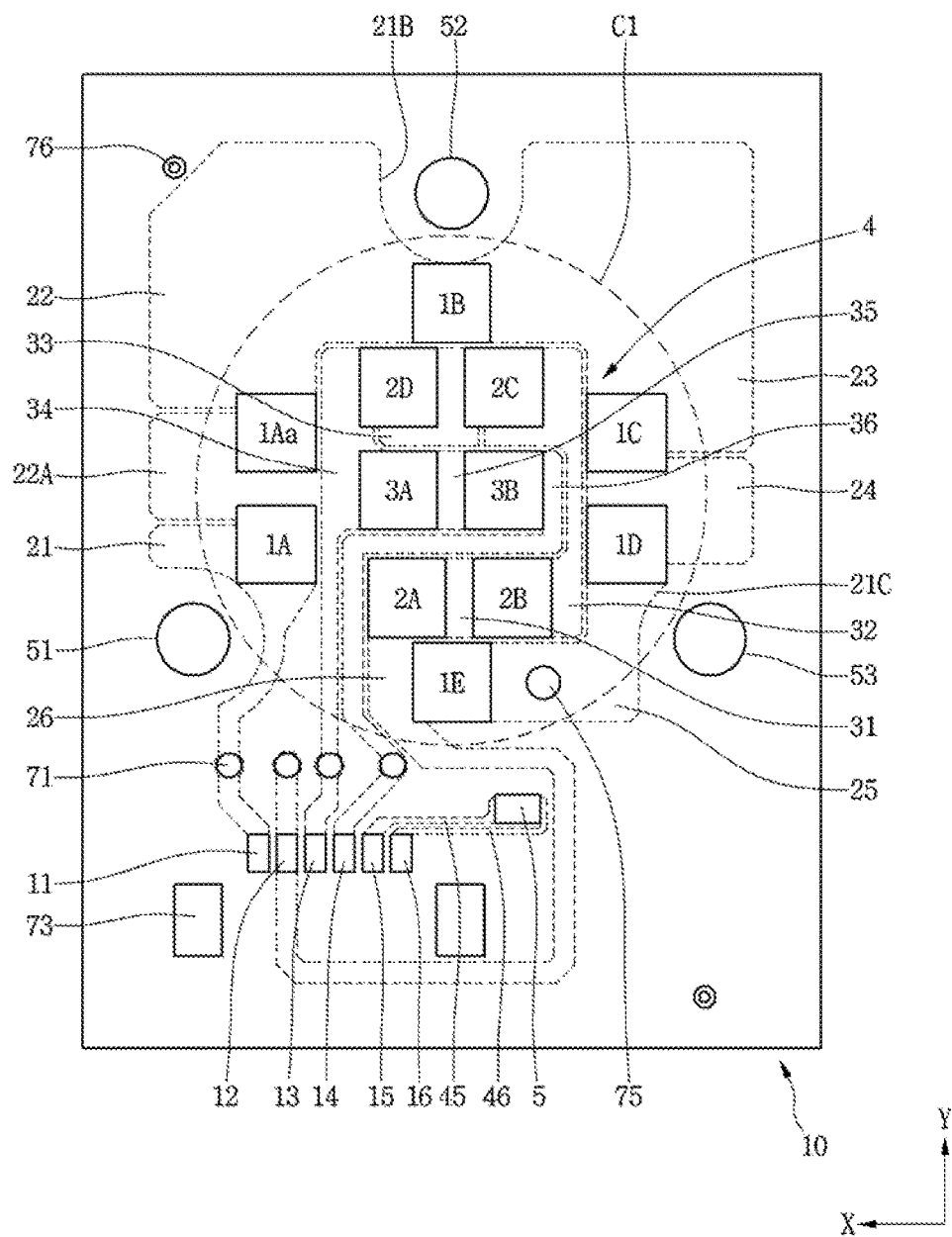
[FIG. 15]

[FIG. 16]
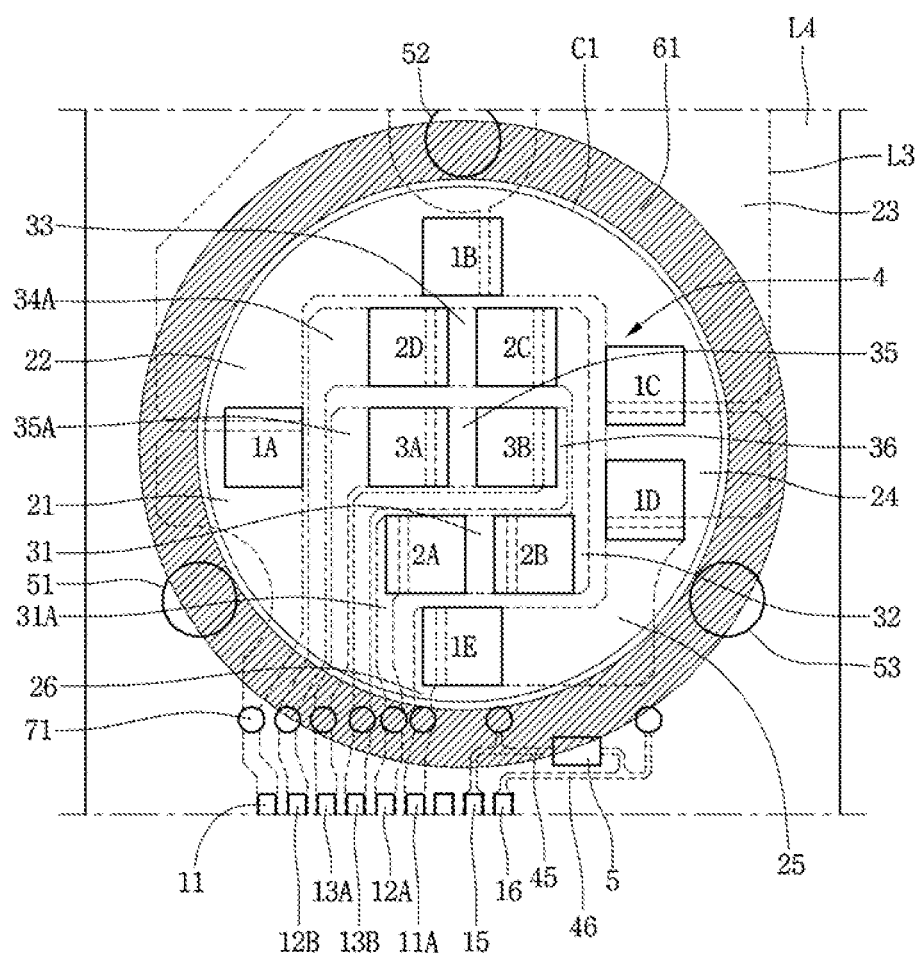

[FIG. 17]
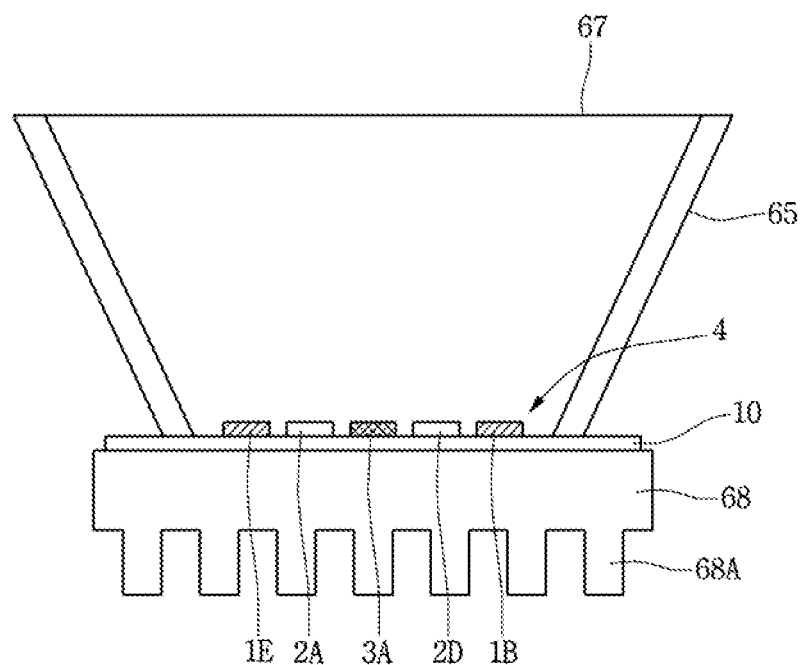
[FIG. 18]
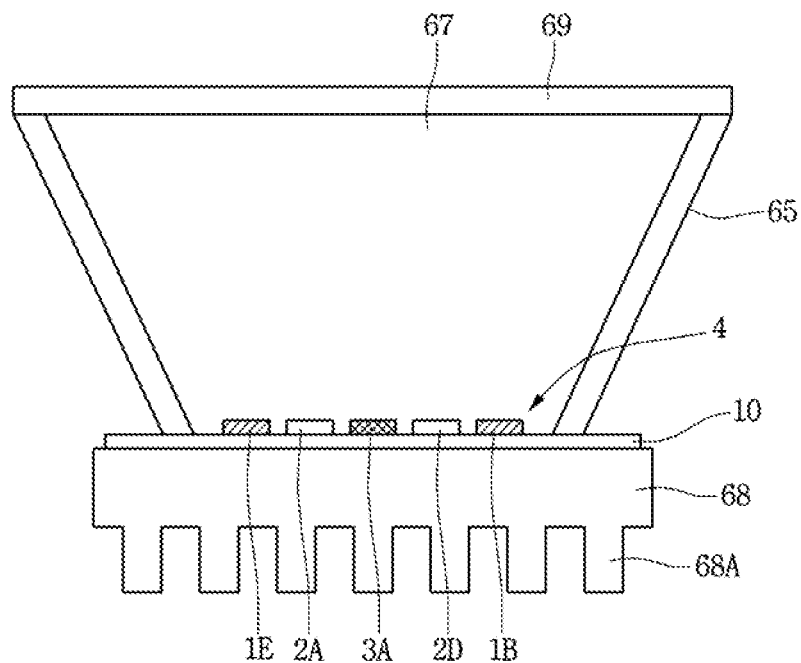

【FIG. 19】
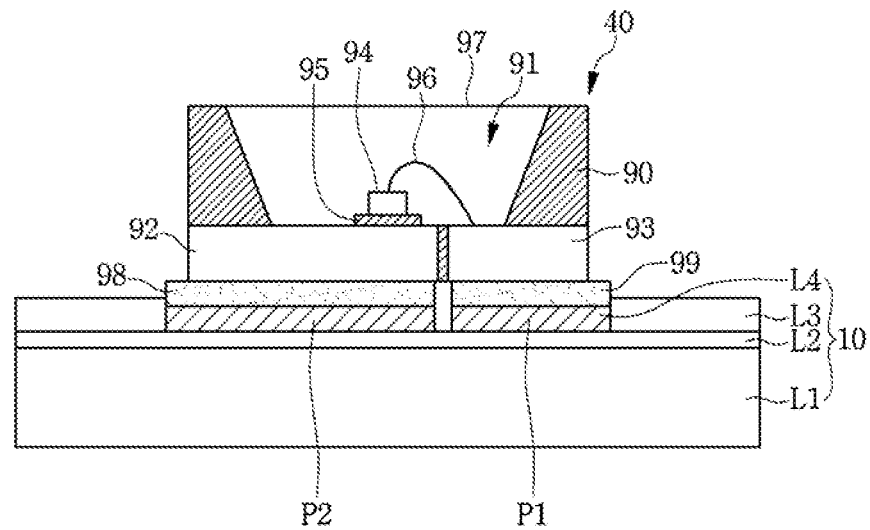
【FIG. 20】
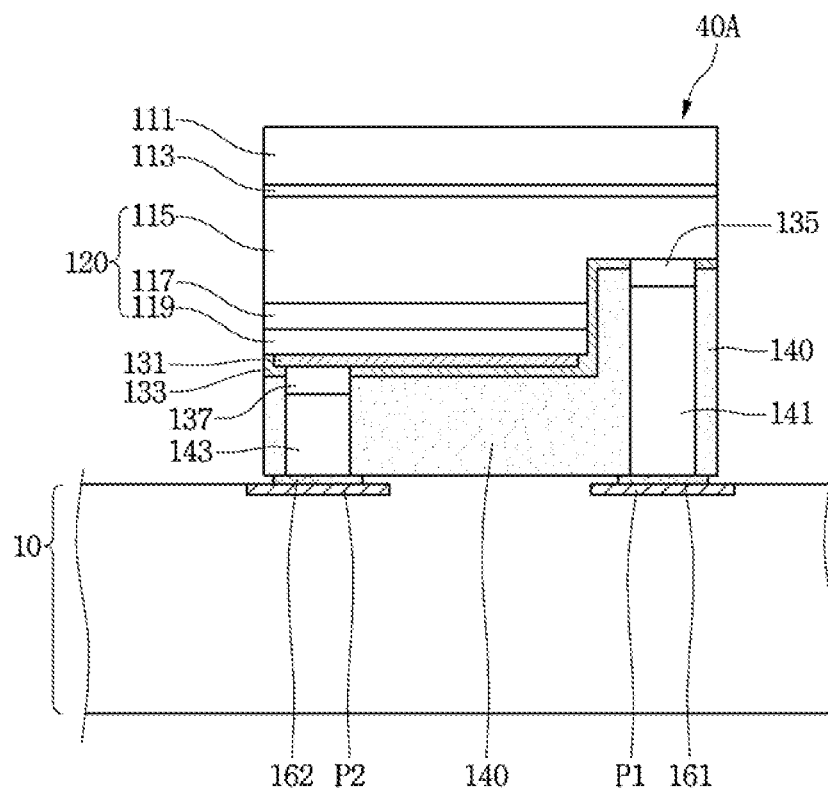

【FIG. 21】
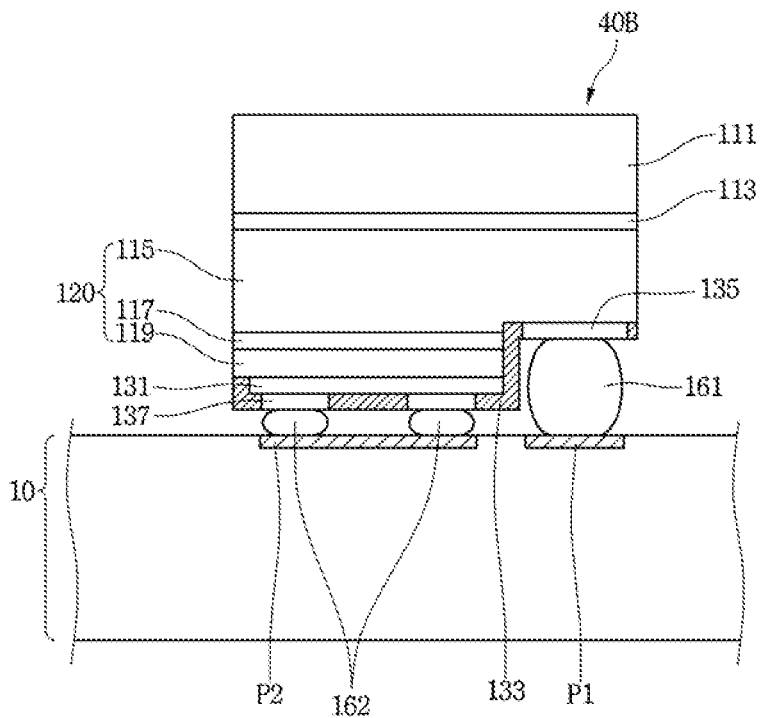
【FIG. 22】
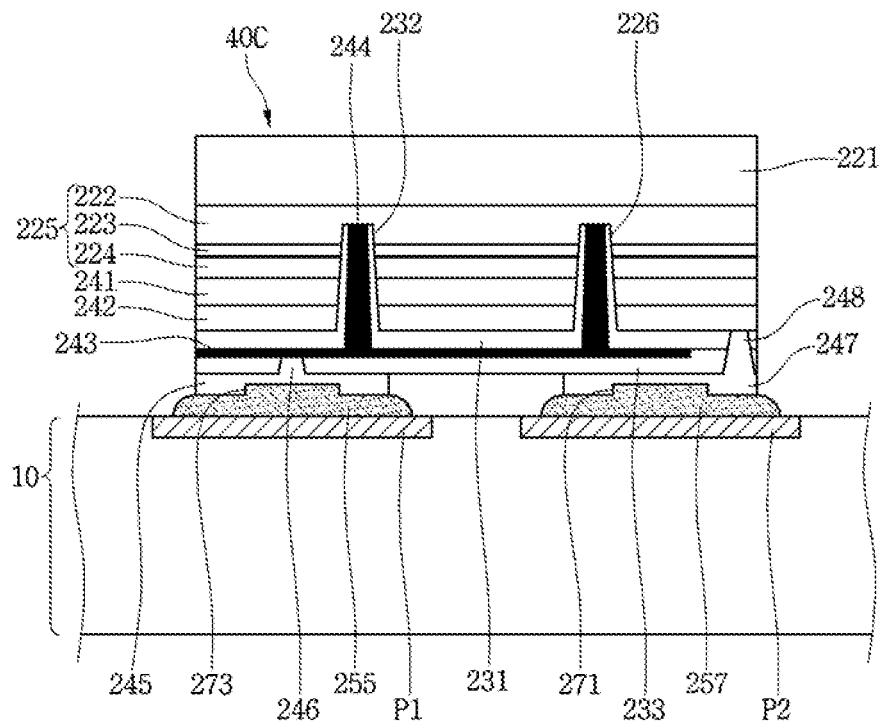

[FIG. 23]
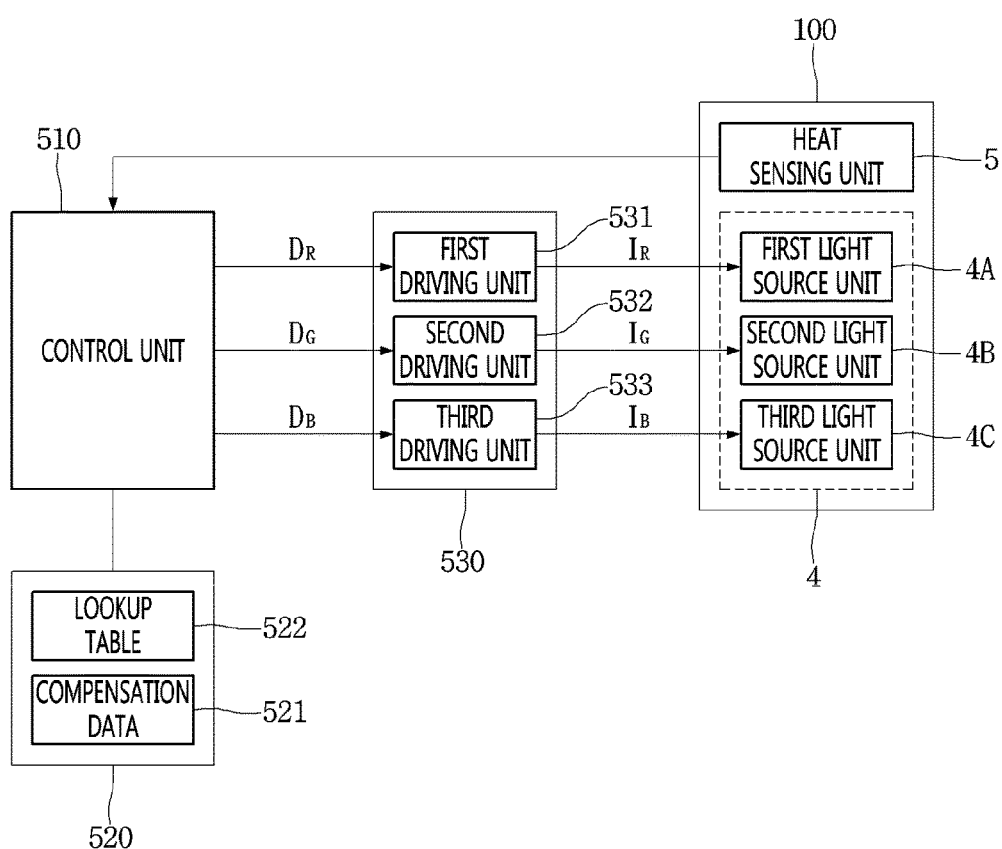

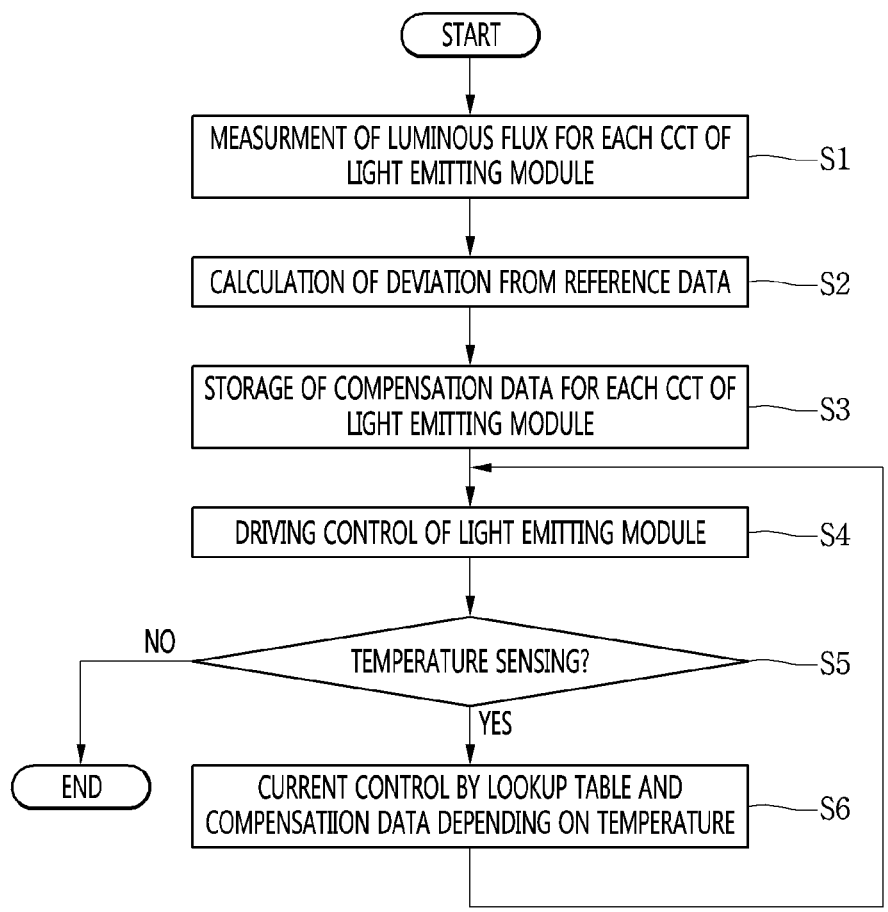
[FIG. 24]

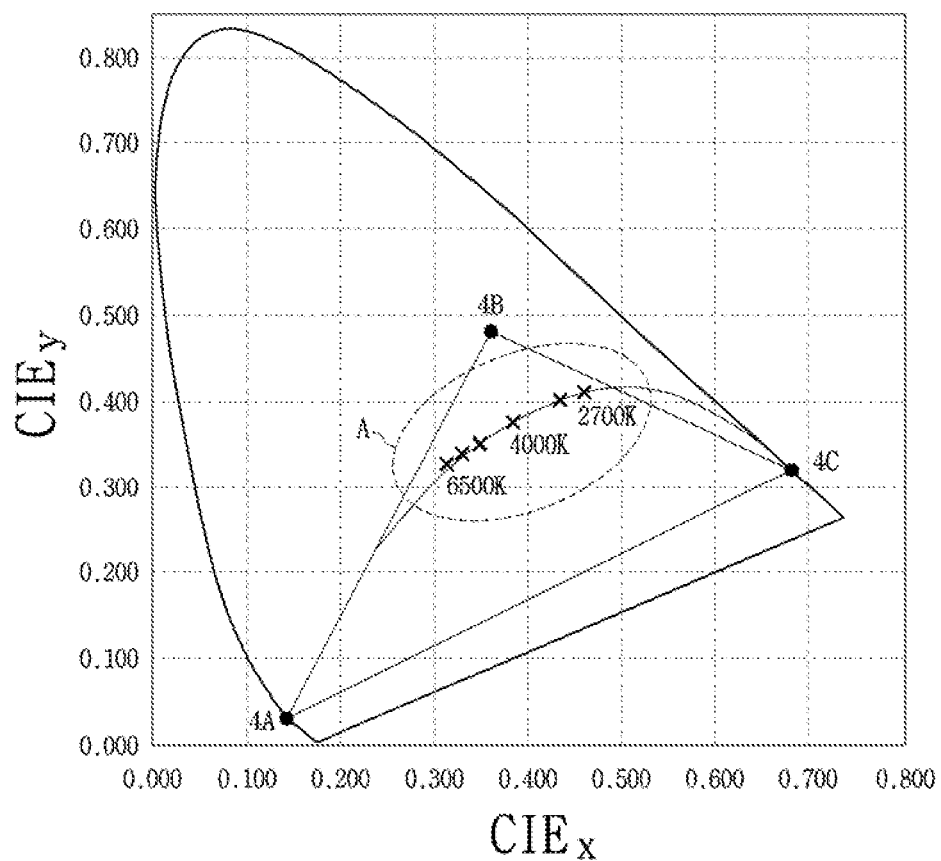
[FIG. 25]

[FIG. 26]
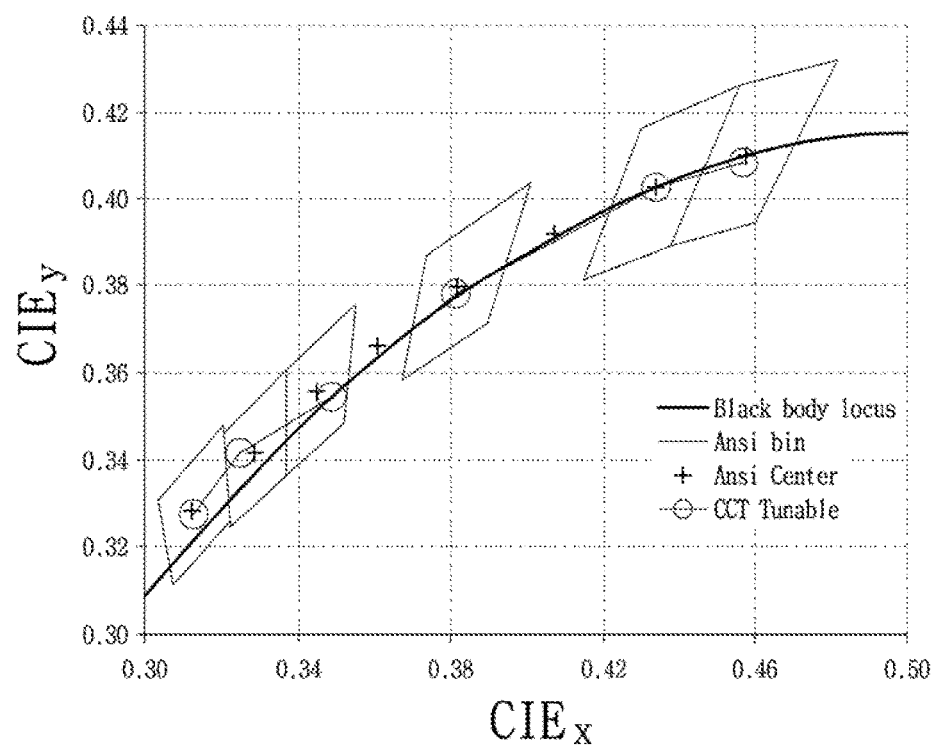

[FIG. 27]
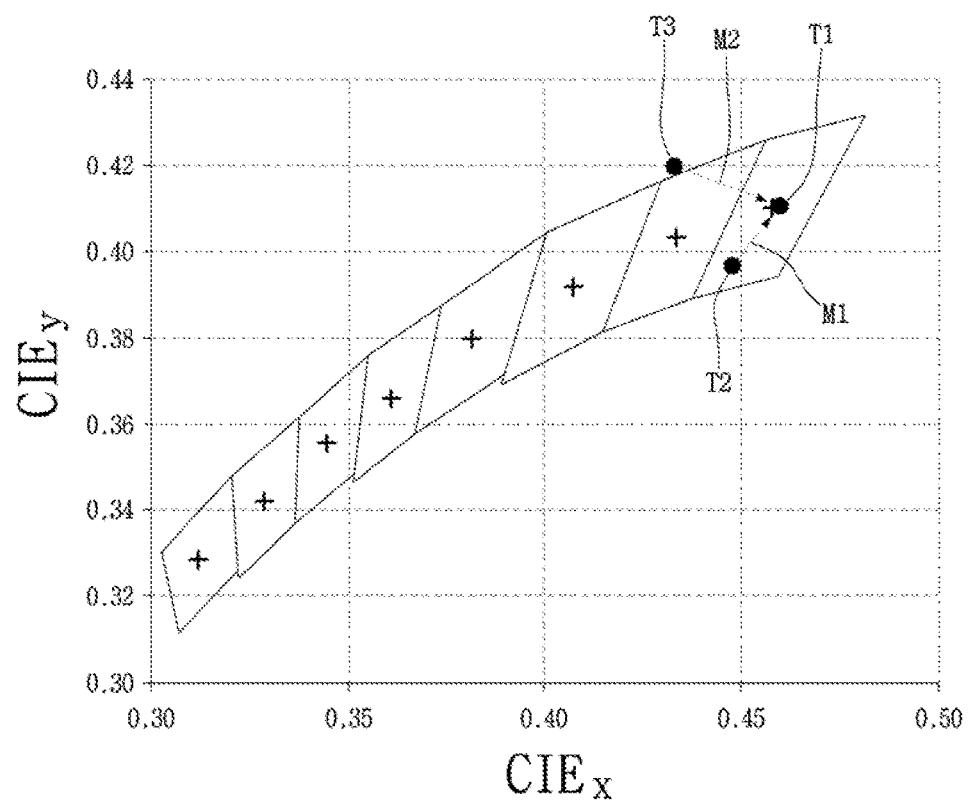

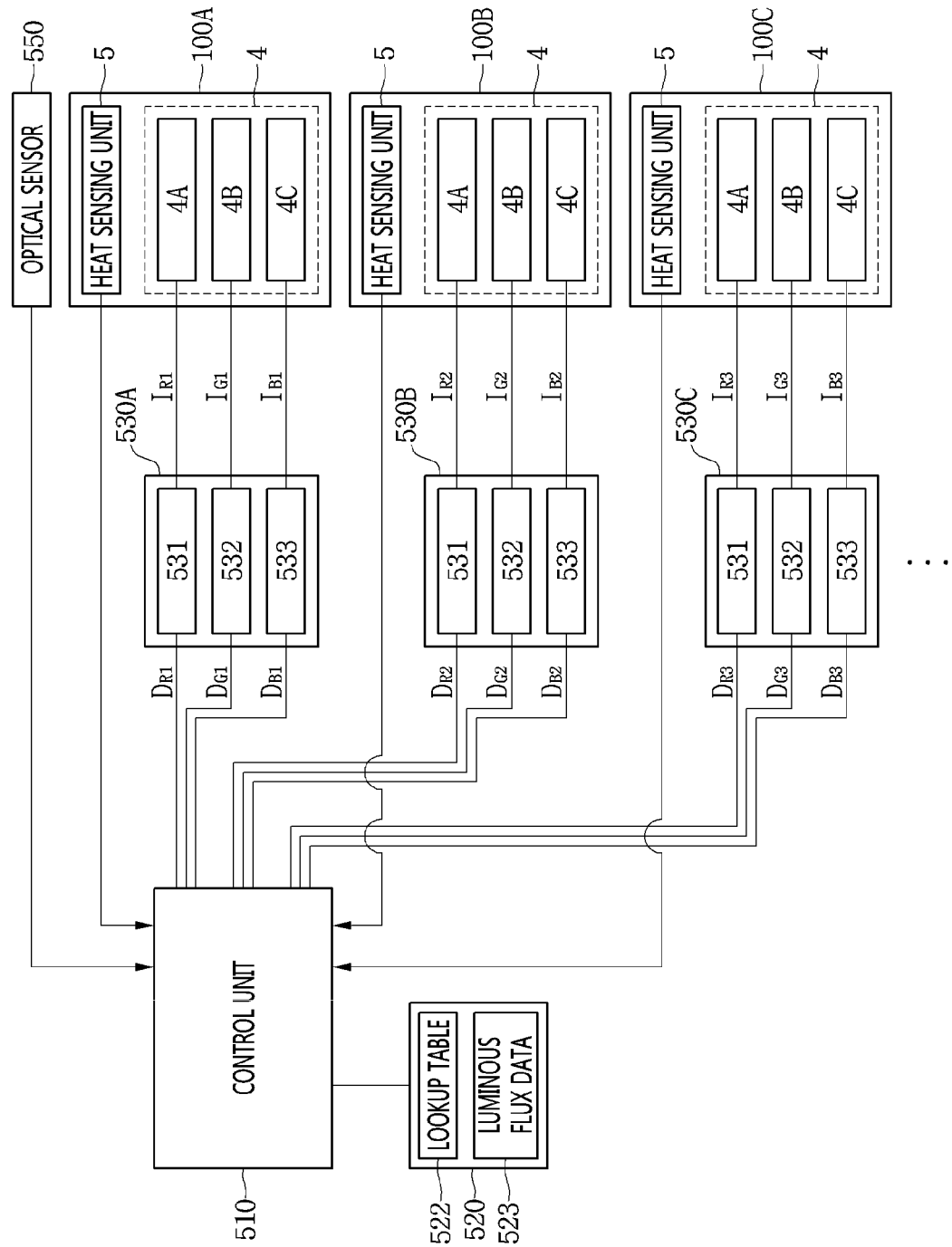
[FIG. 28]

[FIG. 29]
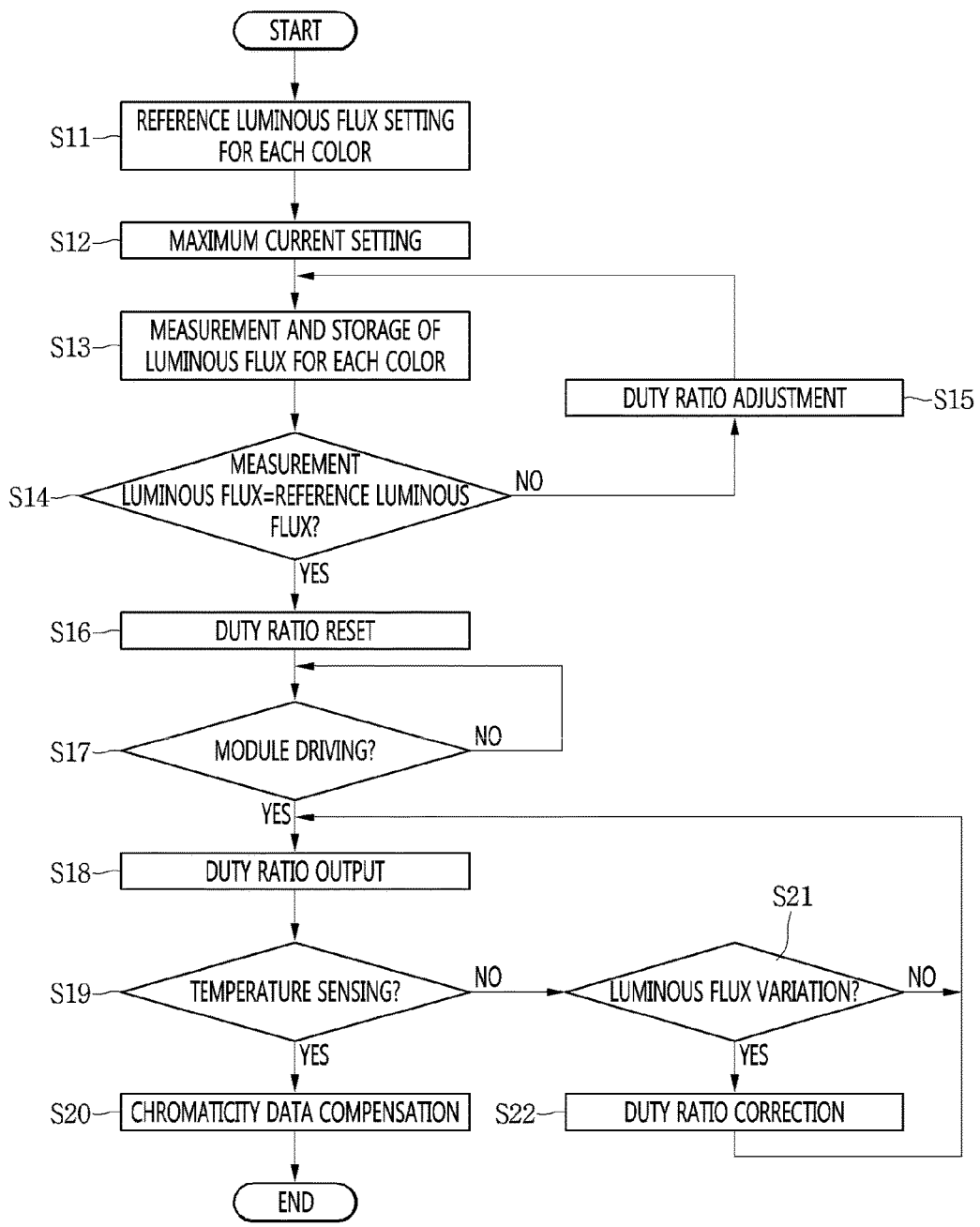

[FIG. 30]
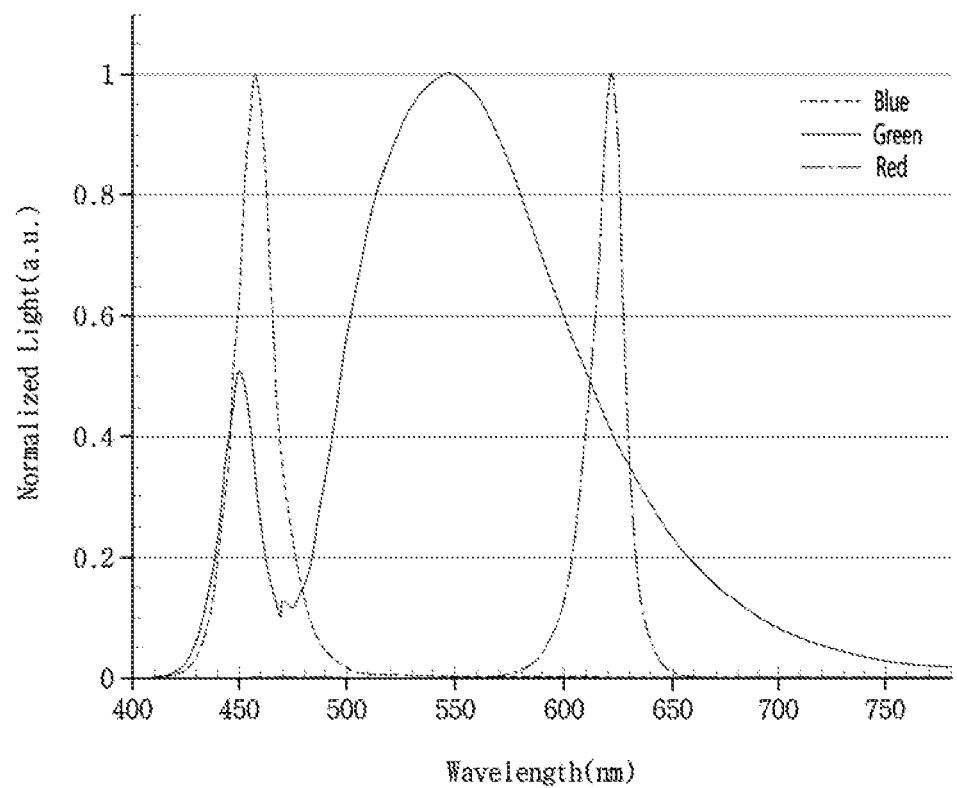

LIGHT EMITTING MODULE AND LIGHTING DEVICE HAVING SAME

CROSS REFERENCE TO RELATED APPLICATIONS

This application is the National Phase of PCT International Application No. PCT/KR2016/002365, filed on Mar. 9, 2016, which claims priority under 35 U.S.C. 119(a) to Patent Application No. 10-2015-0033544, filed in the Republic of Korea on Mar. 11, 2015, all of which are hereby expressly incorporated by reference into the present application.

TECHNICAL FIELD

Embodiments relate to a light emitting module and a lighting apparatus having the same.

BACKGROUND ART

A light emitting device such as a light emitting diode, a kind of semiconductor device that converts electrical energy into light, has received considerable attention as the next generation light source that replaces existing fluorescent and incandescent lamps.

A light emitting diode may generate light using a semiconductor device and thus, may consume relatively low power as compared to incandescent lamps generating light by heating tungsten or fluorescent lamps generating light by allowing ultraviolet light generated through high-pressure discharge to collide with phosphors.

In addition, since a light emitting diode generates light by using a potential gap of a semiconductor device, the light emitting diode has a longer lifetime, faster response characteristics, and eco-friendliness as compared with conventional light sources.

Accordingly, considerable research into replacing conventional light sources with light emitting diodes has been conducted, and the uses of the light emitting diodes as light sources of lighting apparatuses such as various lamps, liquid crystal displays, electronic boards, and streetlamps, which are utilized in indoor and outdoor environments, are being increased.

DISCLOSURE

Technical Problem

An embodiment provides a light emitting module having a plurality of light emitting devices emitting light of different colors.

An embodiment provides a light emitting module in which groups of light emitting devices are positioned in consideration of heat-generation characteristics of the respective light emitting devices.

An embodiment provides a light emitting module in which groups of light emitting devices emitting light of different colors are positioned in consideration of heat-generation characteristics of the respective light emitting devices.

An embodiment provides a light emitting module in which a plurality of first to third light emitting devices emitting light of different colors are disposed in a region of a reflective member on a circuit board.

An embodiment provides a lighting apparatus in which white light emitted at the time of initial operation of a light emitting module compensates with an intensity value of an input current corresponding to white light having a predetermined CCT (correlated color temperature).

An embodiment provides a lighting apparatus which controls an intensity value of the input current of the red, green, and blue light source units by previously compensating for the difference between chromaticity coordinates of white light emitted from the red, green, and blue light source units of the light emitting module and chromaticity coordinates of white light which is a reference for each predetermined CCT, An embodiment provides a lighting apparatus having a control unit for controlling white light emitted from the light emitting module according to a temperature detected from a light emitting module to an intensity value of an input current corresponding to white light having a predetermined CCT.

An embodiment may provide a lighting apparatus capable of reducing the difference in color tone of light emitted from different light emitting modules by controlling the light flux for each color emitted from different light emitting modules to be output with the same value.

An embodiment provides a light emitting module allowing for high color rendition and color control and a lighting apparatus having the same.

Technical Solution

A lighting apparatus according to an embodiment comprises: a circuit board; and a plurality of light emitting modules having first to third light source units for emitting different colors on the circuit board; a control unit for providing a current control signal for controlling a current of each of the first to third light source units; a driver for controlling currents of the first to third light source units with a current control signal of the control unit, and a memory unit for storing luminous flux deviation data of the first to third light source units of each of the plurality of light emitting modules, wherein the first light source unit includes a plurality of first light emitting devices for emitting red light, and the second light source unit includes a plurality of second light emitting devices for emitting green light, and the third light source unit includes a plurality of third light emitting devices for emitting blue light, and the control unit controls currents of the first, second, and third light source units of the plurality of light emitting modules, respectively, according to an intensity value of an input current corresponding to the luminous flux deviation data.

Advantageous Effects

An embodiment can improve the color uniformity of the light emitting module.

An embodiment can improve heat radiation efficiency of a light emitting module by arranging positions of light emitting devices in a light emitting module according to a heat generating characteristics.

An embodiment can minimize a size of a circuit board by arranging positions of a light emitting device emitting different colors in the center of heat generation.

An embodiment can reduce the color deviation of the predetermined CCT of a lighting apparatus.

An embodiment can reduce the difference in color tone between different light emitting modules in a lighting apparatus.

An embodiment can improve reliability of a light emitting module and a lighting apparatus having the same

DESCRIPTION OF DRAWINGS

FIG. 1 is a plan view of a light emitting module according to a first embodiment.

FIG. 2 is a plan view of a circuit board of the light emitting module of FIG. 1.

FIG. 3 is a cross-sectional view of the light emitting module of FIG. 1, taken along line A-A.

FIG. 4 is a circuit configuration view of the light emitting module of FIG. 1.

FIG. 5 is a view illustrating an example of arranging light emitting devices in the light emitting module of FIG. 1.

FIG. 6 is a view illustrating comparison widths of the light emitting device and a wiring in the light emitting module of FIG. 1.

FIG. 7 is a view for explaining a form of arranging the light emitting devices in the light emitting module of FIG. 1.

FIG. 8 is a side cross-sectional view of a light emitting module according to a second embodiment.

FIG. 9 is a cross-sectional view of the light emitting module of FIG. 8, taken along line B-B.

FIG. 10 is a cross-sectional view of the light emitting module of FIG. 9, taken along line C-C.

FIG. 11 is a view illustrating another example of a reflective member of the light emitting module of FIG. 8.

FIG. 12 is a view illustrating a light emitting module according to a third embodiment as another example of the light emitting module of FIG. 9.

FIG. 13 is a cross-sectional view of the light emitting module of FIG. 12, taken along line D-D.

FIG. 14 is another example of a reflective member of the light emitting module of FIG. 13.

FIG. 15 is a plan view of a light emitting module according to a fourth embodiment.

FIG. 16 is another example of the light emitting module of FIG. 15.

FIG. 17 is a side cross-sectional view of the light emitting module of FIG. 15.

FIG. 18 is a view illustrating a light unit having a light emitting module according to an embodiment.

FIG. 19 is a view illustrating one example of a light emitting device of a light emitting module according to an embodiment.

FIG. 20 is a view illustrating a first modified example of a light emitting device of the light emitting module according to the embodiment.

FIG. 21 is a view illustrating a second modified example of a light emitting device of the light emitting module according to the embodiment.

FIG. 22 is a view illustrating a third modified example of a light emitting device of the light emitting module according to the embodiment.

FIG. 23 is a view illustrating a lighting apparatus having a light emitting module according to the embodiment.

FIG. 24 is a view illustrating a lighting control method of a lighting apparatus having a light emitting module according to the embodiment.

FIG. 25 is a view illustrating the color temperature of light which can be emitted from a lighting apparatus according to the embodiment as a CIE 1931 chromaticity diagram.

FIG. 26 is a CIE 1931 chromaticity diagram in which A shown in FIG. 25 is enlarged.

FIG. 27 is a view illustrating an example of chromaticity control on a CIE 1931 chromaticity diagram of FIG. 26 in a lighting apparatus according to the embodiment.

FIG. 28 is a view illustrating a lighting apparatus having a plurality of light emitting modules according to the embodiment.

FIG. 29 is a view illustrating a lighting control method of the lighting apparatus of FIG. 28.

FIG. 30 is a view illustrating a wavelength of a light emitting module according to the embodiment.

MODES OF THE INVENTION

Embodiments of the present invention will be described in detail such that they can be easily implemented by a person in the art to which the present invention pertains. However, the present invention may be embodied into various forms and is not limited to the embodiments described herein.

Through the entire specification, like elements are designated by the same reference numerals. If a portion such as a layer, a film, a region or a plate is mentioned as being positioned on another portion, such an expression may incorporate a case in which there exists still another portion therebetween as well as a case in which the portion is positioned directly on said another portion. On the contrary, if a portion is mentioned as being positioned directly on another portion, it means that there is no still another portion therebetween.

<Light Emitting Module>

Hereinafter, a light emitting module according to a first embodiment of the present invention will be described with reference to FIG. 1 to FIG. 7.

FIG. 1 is a plan view of a light emitting module according to a first embodiment. FIG. 2 is a plan view of a circuit board of the light emitting module of FIG. 1. FIG. 3 is a cross-sectional view of the light emitting module of FIG. 1, taken along line A-A. FIG. 4 is a circuit configuration view of the light emitting module of FIG. 1. FIG. 5 is a view illustrating an example of arranging light emitting devices in the light emitting module of FIG. 1. FIG. 6 is a view illustrating comparison widths of the light emitting device and a wiring in the light emitting module of FIG. 1. FIG. 7 is a view for explaining a form of arranging the light emitting devices in the light emitting module of FIG. 1.

Referring to FIGS. 1 to 7, the light emitting module may include a circuit board 10 and a light source unit 4 disposed on the circuit board 10 and emitting light.

Referring to FIG. 1, the light source unit 4 may include a plurality of first light emitting devices 1A-1E emitting light of a first color, a plurality of second light emitting devices 2A-2D emitting light of a second color, and a plurality of third light emitting devices 3A and 3B emitting light of a third color.

Different numbers of the first light emitting devices 1A, 1B, 1C, 1D, and 1E (hereafter: 1A-1E), the second light emitting devices 2A, 2B, 2C, and 2D (hereafter: 2A-2D), and the third light emitting devices 3A and 3B may be arranged.

The first light emitting devices 1A-1E may be disposed in the outside of the second and third light emitting devices 2A-2D, 3A, and 3B and a number of the first light emitting devices 1A-1E is more than a number of the second light emitting devices 2A-2D or the third light emitting devices 3A and 3B.

The first light emitting devices 1A-1E may have heat-generation characteristics higher than those of the second light emitting devices 2A-2D and the third light emitting devices 3A and 3B. The second light emitting devices 2A-2D may have heat-generation characteristics equal to or higher than those of the third light emitting devices 3A and 3B.

The first light emitting devices 1A-1E may emit light having a wavelength longer than a peak wavelength of the second and third light emitting devices 2A-2D, 3A, and 3B. The second light emitting devices 2A-2D may emit light having a wavelength longer than a peak wavelength of light emitted from the third light emitting devices 3A and 3B. In the light source unit 4, a more number of light emitting devices emitting light of a long wavelength may be disposed while a less number of light emitting devices emitting light of a short wavelength may be disposed.

The first light emitting devices 1A-1E may be red light emitting devices emitting red light in a visible light spectrum, and may emit light having a peak wavelength between 614 nm and 620 nm.

The second light emitting devices 2A-2D may be green light emitting devices emitting green light in a visible light spectrum, and may emit light having a peak wavelength between 540 nm and 550 nm.

The third light emitting devices 3A and 3B may be blue light emitting devices emitting blue light in a visible light spectrum, and may emit light having a peak wavelength (Wp) between 455 nm and 470 nm. A wavelength spectrums of red, green and blue will be referred to FIG. 30.

The first light emitting devices 1A-1E may emit red light, the second light emitting devices 2A-2D may emit green light, and the third light emitting devices 3A and 3B may emit blue light. Accordingly, a light emitted from the light source unit 4 may emit white light.

Referring to FIG. 4 with respect to the light emitting module, the plurality of first light emitting devices 1A-1E may be connected to one another in series, an input terminal of the plurality of second light emitting devices 2A-2D connected to one another in series may be connected to an output terminal of the plurality of first light emitting devices 1A-1E. An input terminal of the plurality of third light emitting devices 3A and 3B connected to each other in series may be connected to an output terminal of the plurality of second light emitting devices 2A-2D.

Each of the light emitting devices 1A-1E, 2A-2D, 3A, and 3B of the light source unit 4 may be a light emitting diode (LED) package or chip.

The circuit board 10 may be formed as one of a resin-based printed circuit board (PCB), a metal core PCB (MCPCB), and a flexible PCB (FPCB). In the circuit board 10, a distance X1 in a first direction X may be longer than a distance Y1 in a second direction Y. The distance X1 in the first direction X may be defined as a width of the circuit board 10.

As in FIG. 2 and FIG. 3, the circuit board 10 may include a metal layer L1 for heat radiation, an insulating layer L2 for insulation from the metal layer L1, and a protective layer L3 and a wiring layer L4 on the insulating layer L2. The wiring layer L4 may be selectively connected to the light source unit 4.

The metal layer L1 of the circuit board 10 may have a thickness corresponding to 60% or more of a thickness of the circuit board 10, and may be formed of a material having high heat conductivity, for example, copper, aluminum, silver or gold, or an alloy containing one or more of these metal elements. The thickness of the metal layer L1 may be about 300 μm or more, for example, 500 μm or more.

The insulating layer L2 may insulate the metal layer L1 and the wiring layer L4 from each other and may contain an epoxy-based or polyimide-based resin. In the interior of the insulating layer L2, solid components such as fillers, glass fibers or the like may be dispersed, and unlike this, organic materials such as oxides, nitrides or the like may be dispersed. The insulating layer L2 may contain materials such as $SiO_2$, $TiO_2$, $SiO_x$, $SiO_xN_y$, $Si_3N_4$, and $Al_2O_3$. A thickness of the insulating layer L2 may be in a range of 5 μm to 7 μm.

The wiring layer L4 of the circuit board 10 may be etched into a predetermined circuit pattern, and the protective layer L3 may be exposed to some regions of an upper surface of the circuit pattern, whereby the regions may serve as pads P1 and P2. The wiring layer L4 may be formed of copper or an alloy containing copper. A surface of the wiring layer L4 may be treated with nickel, silver, gold or palladium or an alloy containing one or more of these elements. A thickness of the wiring layer L4 may be 100 μm or more. The wiring layer L4 may be connected to the light emitting devices 1A,1B,1C,1D,1E, 2A,2B,2C,2D, 3A, and 3B through the plurality of pads P1 and P2.

The protective layer L3 may be a layer protecting the wiring layer L4. The protective layer L3, a layer blocking regions other than the pads from being exposed, may contain an insulating material such as solder resist. The protective layer L3 may exhibit white color and may improve light reflection efficiency. The pads P1 and P2 of the protective layer L3 may be opened. The opened region may be selectively formed in a shape from among a circular shape, a hemispherical shape, a polygonal shape, and an atypical shape, but is not limited thereto.

As in FIG. 1 and FIG. 2, the wiring layer L4 of the circuit board 10 may include a first wiring part 21,22,23,24,25, and 26 connecting the plurality of first light emitting devices 1A-1E, a second wiring part 31,32,33 and 34 connecting the plurality of second light emitting devices 2A-2D, and a third wiring part 35 and 36 connecting the plurality of third light emitting devices 3A and 3B.

The first wiring part 21, 22, 23, 24, 25, and 26 may be disposed in the outside of the second wiring part 31, 32, 33 and 34 and the third wiring part 35 and 36. The first wiring part 21, 22, 23, 24, 25, and 26 may be disposed in the outside of the second and third light emitting devices 2A,2B,2C, 2D,3A, and 3B. Wirings of the first wiring part 21, 22, 23, 24, 25, and 26 may be spaced apart from one another and may connect the plurality of first light emitting devices 1A-1E to one another.

The first wiring part 21, 22, 23, 24, 25, and 26 may connect the first light emitting devices 1A-1E to one another in series. The plurality of second light emitting devices 2A-2D may be disposed in the inside of the first wiring part 21,22,23,24,25, and 26 and may be connected to one another in series by the second wiring part 31,32, 33 and 34. The plurality of third light emitting devices 3A and 3B may be disposed among the plurality of first light emitting devices 1A-1E and may be connected to each other in series by the third wiring part 35 and 36.

The first wiring part 21, 22, 23, 24, 25, and 26 may include a plurality of wirings, for example, first to sixth wirings 21, 22, 23, 24, 25, and 26. The wiring number of the first wiring part 21, 22, 23, 24, 25, and 26 may be, for example, greater than the number of the first light emitting devices 1A-1E by one.

Each of the wirings of the first wiring part 21, 22, 23, 24, 25, and 26 may have an upper surface area greater than an upper surface area of each of the wirings of the second and third wiring parts 31, 32, 33, 34, 35, and 36.

Both terminal wirings of the first wiring part 21, 22, 23, 24, 25, and 26 may be connected to first and second connection terminals 11 and 12 through line wirings. For example, the first and sixth wirings 21 and 26 may be connected to a connector (70 of FIG. 4) through the first and second connection terminals 11 and 12. Each of the first and sixth wirings 21 and 26 may have a surface area smaller than that of each of the second to fourth wirings 22, 23, 24 and 25. The surface areas of the second to fourth wirings 22, 23, 24 and 25 may be greater than those of the first and sixth wirings 21 and 26 to thereby prevent the concentration of heat generated from the light source unit 4.

Since upper surface areas of the second to fourth wirings 22, 23, 24 and 25 of the first wiring part 21, 22, 23, 24, 25, and 26 may be disposed wider than those of the first and sixth wirings 21 and 26, heat radiation efficiency of the first light emitting devices 1A-1E may be improved, and operating reliability of the first light emitting devices 1A-1E may be improved.

The surface areas or upper surface areas of the second and third wirings 22 and 23 disposed in the opposite side of connection terminals 11,12,13,14,15, and 16 on the circuit board 10 may be wider than the surface areas or upper surface areas of remaining wirings 21, 24, 25 and 26, whereby heat generated from the first, second and third devices 1A, 1B, and 1C disposed in a heat concentration region among the plurality of first light emitting devices 1A-1E may be effectively radiated.

The first to sixth wirings 21, 22, 23, 24, 25, and 26 may include the pads P1 and P2 disposed below the first light emitting devices 1A-1E. For example, the pads P1 and P2 of the first to sixth wirings 21, 22, 23, 24, 25, and 26 may be electrically connected to the respective first light emitting devices 1A-1E. The pads P1 and P2 may be regions from which the protective layer L3 has been removed.

The plurality of first light emitting devices 1A-1E may be disposed in opposite sides based on regions of the second light emitting devices 2A-2D and the third light emitting devices 3A and 3B. For example, the first device 1A and the third and fourth devices 1C and 1D may be disposed opposite each other, and the second device 1B and the fifth device 1E may be disposed opposite each other among the plurality of first light emitting devices 1A-1E. Alternatively, at least two of the plurality of first light emitting devices 1A-1E may be symmetrically positioned with respect to each other and for example, the second device 1B and the fifth device 1E may be symmetrically positioned with respect to each other.

The second wiring part 31, 32, 33 and 34 may include seventh to tenth wirings 31, 32, 33 and 34. The second wiring part 31, 32, 33 and 34 may include the seventh wiring 31 connected to an output terminal of the first wiring part 21, 22, 23, 24, 25, and 26, for example, the sixth wiring 26, the eighth wiring 32 adjacent to the seventh wiring 31, the ninth wiring 33 adjacent to the eighth wiring 32, and the tenth wiring 34 adjacent to the ninth wiring 33.

An output terminal of the first wiring part 21, 22, 23, 24, 25, and 26 may be an input terminal of the second wiring part 31, 32, 33 and 34. For example, the sixth wiring 26 of the first wiring part 21, 22, 23, 24, 25, and 26 may be an input wiring of the second wiring part 31,32,33 and 34. The second wiring part 31, 32, 33 and 34 may connect the first to fourth devices 2A-2D of the second light emitting devices 2A-2D to one another in series.

An output terminal of the second wiring part 31,32,33 and 34 may be connected to an input terminal of the third wiring part 35 and 36. For example, the tenth wiring 34 of the output terminal of the second wiring part 31,32,33 and 34 may be a wiring of the input terminal of the third wiring part 35 and 36. The third wiring part 35 and 36 may connect the first and second devices 3A and 3B of the third light emitting devices 3A and 3B to each other in series.

As in FIG. 4, the output terminal of the plurality of first light emitting devices 1A-1E may be connected to the input terminal of the plurality of second light emitting devices 2A-2D, and the output terminal of the plurality of second light emitting devices 2A-2D may be connected to the input terminal of the plurality of third light emitting devices 3A and 3B.

At least two devices 2A and 2B of the second light emitting devices 2A-2D may be disposed in a region between the fifth device 1E of the first light emitting devices 1A-1E and the third light emitting devices 3A and 3B, and the remaining at least two devices may be disposed in a region between the second device 1B of the first light emitting devices 1A-1E and the third light emitting devices 3A and 3B.

In the first light emitting devices 1A-1E, an interval between the second and fifth devices 1B and 1E may be greater than an interval between the first device 1A and the third device 1C or the fourth device 1D.

The plurality of third light emitting devices 3A and 3B may be disposed among the devices 1A, 1C, and 1D of the first light emitting devices 1A-1E in the first direction X, and may be disposed among the devices 2A-2D of the second light emitting devices 2A-2D in the second direction Y. The first direction X may be a width direction of the circuit board 10, and the second direction Y may be a direction of the length Y1 longer than the width X1 of the circuit board 10.

The plurality of first light emitting devices 1A-1E may be disposed in opposite sides each other or facing to each other based on regions of the second light emitting devices 2A-2D and the third light emitting devices 3A and 3B.

The plurality of second light emitting devices 2A-2D may be disposed in opposite sides each other or facing to each other based on regions of the third light emitting devices 3A and 3B.

The number of the plurality of second light emitting devices 2A-2D may be smaller than the number of the first light emitting devices 1A-1E, and may be greater than the number of the third light emitting devices 3A and 3B. The number of the second light emitting devices 2A-2D may be 150% or more, for example, 200% or more of the number of the third light emitting devices 3A and 3B. The third light emitting devices 3A and 3B may include at least two third light emitting devices.

The number of the first light emitting devices 1A-1E may be 125% or more of the number of the second light emitting devices 2A-2D. The respective devices of the first to third light emitting devices 1A-1E, 2A-2D, 3A, and 3B may be arranged in different numbers according to luminous intensity, whereby luminance uniformity of light emitted from the circuit board 10 may be improved.

The surface area of the first wiring part 21,22,23,24,25, and 26 connected to the first light emitting devices 1A-1E may be wider than the surface area of the second wiring part 31, 32, 33 and 34 connected to the second light emitting devices 2A-2D. The surface area of the second wiring part 31, 32, 33 and 34 connected to the second light emitting devices 2A-2D may be wider than the surface area of the third wiring part 35 and 36 connected to the third light emitting devices 3A and 3B. Accordingly, the first light emitting devices 1A-1E having the highest heat-generation characteristics may be disposed in the outermost portion of the light source unit 4, and heat emitted from the first light emitting devices 1A-1E may be effectively radiated. In addition, it may be possible to prevent heat emitted from the first light emitting devices 1A-1E from affecting other second and third light emitting devices 2A-2D, 3A, and 3B.

As in FIG. 1 and FIG. 2, a plurality of openings 51, 52 and 53 may be disposed in the outside of arbitrary wirings of the first wiring part 21,22,23,24,25, and 26. The plurality of openings 51, 52 and 53 may include a first opening 51 disposed in an outside 21A of the first wiring 21, a second opening 52 disposed in an outside 21B of the second and third wirings 22 and 23, and a third opening 53 disposed in an outside 21C of the fourth and fifth wirings 24 and 25.

A linear shape connecting the first to third openings 51, 52, and 53 to each other may be a triangular shape. The plurality of openings 51, 52 and 53 may be disposed in the outside of the light source unit 4 and may support a lower portion of a reflective member to be described later.

The pads P1 and P2 of the first to sixth wirings 21,22, 23,24,25, and 26 may be disposed inwardly of positions of the first to third openings 51, 52, and 53. The light source unit 4 may be disposed in the inside of a first virtual circle C1 having a predetermined radius from an optional center of the circuit board 10. A diameter D1 of the first virtual circle C1 may be 19 mm or more, for example, 22 mm or more, and such a diameter D1 may be varied depending on sizes and the numbers of the first to third light emitting devices 1A-1E, 2A-2D, 3A, and 3B of the light source unit 4. The first virtual circle C1 defining a region of the light source unit 4 may be in a range of 19 mm to 30 mm, for example, in a range of 20 mm to 25 mm. The first virtual circle C1 may define a boundary region of the reflective member capable of being disposed in a circumferential portion of the light source unit 4. The diameter D1 of the first virtual circle C1 may be set in consideration of the uniformity of luminous flux and luminance of light generated from the light source unit 4.

The first to third wiring parts 21,22,23,24,25,26,31,32,33, 34, 35, and 36 may be selectively connected to the connection terminals 11, 12, 13 and 14. Test pads 71 may be exposed to respective lines adjacent to the connection terminals 11, 12, 13 and 14. Whether or not the respective wirings operate, a current and a voltage, and the like may be tested through the test pads 71.

A recognition mark 76 may be disposed on the circuit board 10. The recognition mark 76 may be disposed outside the first virtual circle C1. The recognition mark 76 may be a mark for setting coordinates at the time of surface mounting technology (SMT). The recognition mark 76 may be disposed outwardly of the first wiring part 21, 22, 23, 24, 25, and 26.

A module temperature sensing region 75 may be disposed in an arbitrary wiring of the first wiring part 21, 22, 23, 24, 25, and 26, and the module temperature sensing region 75 may be a region in which a portion of the wiring is exposed. The module temperature sensing region 75 may be disposed adjacent to arbitrary devices 1D and 1E of the first light emitting devices 1A-1E. Accordingly, the module temperature sensing region 75 may be disposed adjacent to arbitrary devices 1D and 1E of the first light emitting devices 1A-1E, which are most sensitive to temperature, and may provide a module temperature.

A heat sensing device 5 may be disposed on the circuit board 10. The heat sensing device 5 may be disposed in a region adjacent to any device of the first light emitting devices 1A-1E, for example, the sixth device 1E. The heat sensing device 5 may be disposed adjacent to any device 1E of the first light emitting devices 1A-1E having the highest heat-generation characteristics among the first to third light emitting devices 1A-1E, 2A-2D, 3A, and 3B.

The heat sensing device 5 may be connected to the connection terminals 15 and 16 through a fourth wiring part 45 and 46. The heat sensing device 5 may be a thermistor, a variable resistor having a resistance value varied according to temperature. The heat sensing device 5 may be a negative temperature coefficient (NTC) in which specific resistance is lowered in accordance with an increase in temperature. Alternatively, the heat sensing device 5 may be a positive temperature coefficient (PTC).

The connector 70 may be disposed in the connection terminals 11, 12, 13, 14, 15, and 16 and an external connection terminal 73. The connector 70 may selectively supply power to the connection terminals 11, 12, 13, and 14 and drive the first to third light emitting devices 1A-1E, 2A-2D, 3A, and 3B to be turned on or off.

As in FIG. 4, The first to third light emitting devices 1A-1E, 2A-2D, 3A, and 3B may be selectively driven or simultaneously turned on or off, but are not limited thereto. The light source unit 4 includes a first light source unit 4A which is a group of the plurality of first light emitting device 1A-1E, a second light source unit 4B which is a group of the plurality of second light emitting device 2A-2D, and a third light source unit 4C which is a group of the plurality of third light emitting device 3A and 3B. The first to third light source unit 4A, 4B, 4C may be individually driven.

In the circuit board 10, an interval D4 between the opening 51, 52 or 53 and the wring layer L4 may be 1.2 mm or more, for example, 1.5 mm or more. The interval D4 may prevent electrical interference with the wiring layer L3.

In the circuit board 10, the first wiring part 21, 22, 23, 24, 25, and 26 may be spaced apart from an edge of the circuit board 10 by a predetermined distance D2. The distance D2 may be 2.5 mm or more, for example, 3 mm or more. When the distance D2 is extremely small, a leakage current may occur through the edge of the circuit board 10.

The external connection terminal 73 may be spaced apart from the edge of the circuit board 10 by a predetermined distance D3, and the distance D3 may be wider than the distance D2. The distance D3 may be 3.5 mm or more, for example, 4 mm or more. The distance D3 may be varied depending on a supply voltage.

Referring to FIG. 5 and FIG. 6, a width W3 of the seventh wiring 31 of the second wiring part 31, 32, 33 and 34 may be narrower than a width W2 of the ninth wiring 99. An interval W5 between the first and second devices 2A and 2B of the second light emitting devices 2A-2D, and the third light emitting devices 3A and 3B may be identical to an interval between the third and fourth devices 2C and 2D of the second light emitting devices 2A-2D, and the third light emitting devices 3A and 3B. Although the width W3 of the seventh wiring 31 and the width W2 of the ninth wiring 33 are different from each other, the same interval W5 between the second light emitting devices and the third light emitting devices 3A and 3B may be provided, whereby the seventh wiring 31 of the second wiring part 31, 32, 33 and 34 and a width W4 of a connection wiring 14A between the third wiring part 35 and 36 may be compensated for by the width W2 of the ninth wiring 33 of the second wiring part 31, 32, 33 and 34.

Widths W1 of pads P1 and P2 of the seventh and ninth wirings 31 and 33 may be identical to each other, but are not limited thereto. The widths W1 of the pads P1 and P2 of the seventh and ninth wirings 31 and 33 may be identical to widths (for example, W1) of the second light emitting devices 2A, 2B, 2C and 2D in the second direction, but are not limited thereto.

The width W2 of the ninth wiring 33 may be wider than the widths W1 of the pads P1 and P2 of the ninth wiring 33.

The eighth wiring 32 of the second wiring part 31, 32, 33 and 34 may include a first region R1 adjacent to the seventh wiring 31, a second region R2 adjacent to the ninth wiring 33, and a third region R3 diverged in regions between the third and fourth devices 1C and 1D of the first light emitting devices 1A-1E and the second device 3B of the third light emitting devices 3A and 3B. A width of the first region R1 may be identical to the width W1 of the seventh wiring 31, and a width of the third region R3 may be identical to the width W2 of the ninth wiring 33 but may be wider than the width of the first region R1. A width of the second region R2 of the eighth wiring 32 may be wider than the widths (for example, W1) of the second light emitting devices 2A-2D in the second direction.

In this manner, since the interval W5 between the first and second devices 2A and 2B of the second light emitting devices 2A-2D, and the third light emitting devices 3A and 3B may be identical to that between the third and fourth devices 2C and 2D of the second light emitting devices 2A-2D, luminance uniformity among the devices may be provided.

The third wiring part 35 and 36 may connect the third light emitting devices 3A and 3B to each other in series. Widths of the wirings of the third wiring part 35 and 36 may be identical to widths of the third light emitting devices 3A and 3B.

Referring to FIG. 7, an outer boundary line of the light source unit 4 on the circuit board 10 may be implemented by a first virtual circle C1. The first virtual circle C1 may have a diameter smaller than that of a virtual circle C4 passing the plurality of openings 51, 52 and 53, and may have a diameter greater than that of a second virtual circle C2 passing the plurality of first light emitting devices 1A-1E. The first virtual circle C1 may have a predetermined radius about a center D11, a region between the plurality of third light emitting devices 3A and 3B.

The plurality of first light emitting devices 1A-1E may be disposed inwardly of the first virtual circle C1. The first virtual circle C1 may be disposed outwardly of the plurality of first to third light emitting devices 1A-1E, 2A-2D, 3A, and 3B. The plurality of first light emitting devices 1A-1E may be more adjacent to the first virtual circle C1 as compared to the plurality of second and third light emitting devices 2A-2D, 3A, and 3B.

The second virtual circle C2, a circle passing the plurality of first light emitting devices 1A-1E, may be disposed outwardly of the plurality of second light emitting devices 2A-2D. A third virtual circle C3, a circle passing the plurality of second light emitting devices 2A-2D, may be disposed inwardly of the plurality of first light emitting devices 1A-1E and may be disposed outwardly of the third light emitting devices 3A and 3B. The center D11 of the first to third virtual circles C1, C2, and C3 may be the center of the light source unit 4, and may be the region between the plurality of third light emitting devices 3A and 3B.

A diameter D1 of the first virtual circle C1 may be smaller than a distance D5 between the first to third openings, which may be varied depending on the number of the openings 51, 52 and 53. The second virtual circle C2 passing the plurality of first light emitting devices 1A-1E may be disposed inwardly of positions of the first to third openings 51, 52 and 53. Accordingly, the light source unit 4 may be disposed at an optimal position in consideration of thermal characteristics. The light source unit 4 may be disposed within a region of the first virtual circle C1.

FIG. 8 is a side cross-sectional view of a light emitting module according to a second embodiment. FIG. 9 is a cross-sectional view of the light emitting module of FIG. 8, taken along line B-B. FIG. 10 is a cross-sectional view of the light emitting module of FIG. 9, taken along line C-C.

Referring to FIG. 8 to FIG. 10, the light emitting module 100 may include the light source unit 4 having the plurality of first to third light emitting devices 1A-1E, 2A-2D, 3A, and 3B according to the embodiment on the circuit board 10, and a reflective member 61 disposed in the circumference of the light source unit 4.

The light emitting module 100 may include the light source unit 4 having the plurality of first to third light emitting devices 1A-1E, 2A-2D, 3A, and 3B on the circuit board 10 according to the embodiment. This configuration will be provided with reference to the description of the first embodiment.

The reflective member 61 may be attached onto the circuit board 10. The reflective member 61 may enclose the light source unit 4 having the plurality of first to third light emitting devices 1A-1E, 2A-2D, 3A, and 3B, and may reflect emitted light.

The reflective member 61 may have a reflective surface reflecting light from the first to third light emitting devices 1A-1E, 2A-2D, 3A, and 3B. The reflective member 61 may be substantially perpendicular with respect to the circuit board 10 or may form an acute angle θ1 with an upper surface of the circuit board 10. The reflective surface may be formed by a coating method or a deposition method using a material capable of easily reflecting light.

The first light emitting devices 1A-1E may be more adjacent to the reflective member 61 as compared to the second and third light emitting devices 2A-2D, 3A, and 3B.

The reflective member 61 may contain a resin material or a metal material. The resin material may include a plastic material or a resin material such as silicon or epoxy. The reflective member 61 may include the resin material such as silicon or epoxy, and a metal oxide may be added in the interior of the reflective member 61. The metal oxide may have a refractive index higher than that of the molding member and for example, may include $TIO_2$, $Al_2O_3$, or $SiO_2$. The metal oxide may be added to the reflective member in an amount of 5 w % or more, and may exhibit reflectivity of 50% or more, for example, 78% or more, with respect to incident light.

When the reflective member 61 is formed of a metal material, the reflective member 61 may be spaced apart from the first to third wiring parts of the circuit board 10, and may contain at least one of aluminum (Al), silver (Ag), an aluminum alloy, or a silver alloy.

A height H1 of the reflective member 61 may be a height allowing for the color mixture of light emitted from the light source unit 4, but is not limited thereto.

The height H1 of the reflective member 61 may be greater than the diameter D1 of the first virtual circle C1 illustrated in FIG. 1 and FIG. 9 or a diameter of the reflective member 61 in order to minimize differences in color senses. The height H1 of the reflective member 61 may be in a range from equal to or greater than 150% to equal to or less than 300% of the diameter D1 of the first virtual circle C1 illustrated in FIG. 1 and FIG. 9 or the diameter of the reflective member 61. The height H1 of the reflective member 61 may be in a range of 150% to 250% of the diameter D1 of the first virtual circle C1 illustrated in FIG.

1 and FIG. 9 or the diameter of the reflective member 61. When the height H1 of the reflective member 61 deviates from the range, light reflective efficiency or light extraction efficiency may be degraded, thereby leading to differences in color senses or a lowering in luminance.

Here, the heat sensing device 5 may be disposed outwardly of the reflective member 61.

The light emitting module may be disposed on the circuit board 10 and may include a light-transmissive member 67 disposed within the reflective member 61. The light-transmissive member 67 may contain a transparent resin material such as silicon or epoxy. A phosphor may not be added in the light-transmissive member 67. As another example, at least one of a dispersing agent, a scattering agent, or a phosphor may be added in the light-transmissive member 67, but the light-transmissive member 67 is not limited thereto.

The light-transmissive member 67 may contact the upper surface of the circuit board 10 and an inside surface of the reflective member 61. A thickness of the light-transmissive member 67 may be identical to or higher than the height of the reflective member 61, but is not limited thereto. An upper surface of the light-transmissive member 67 may include at least one of a convex surface, a concave surface or a flat surface.

An upper diameter of the light-transmissive member 67 may be wider than a lower diameter D3 thereof.

The reflective member 61 may be disposed in the outside or a boundary line of the first virtual circle C1 illustrated in FIG. 9. The reflective member 61 may have a circular shape, an oval shape, or a polygonal shape when viewed from the top thereof.

The reflective member 61 may be coupled to the openings 51, 52 and 53 of the circuit board 10 of FIG. 9. As in FIG. 9 and FIG. 10, a lower portion 62 of the reflective member 61 may be extended to the openings 51, 52 and 53 of the circuit board 10. The openings 51, 52 and 53 of the circuit board 10 may support the lower portion 62 of the reflective member 61 in different positions thereof. The reflective member 61 may be coupled to the plurality of openings 51, 52 and 53 disposed in the circuit board 10 and may be supported on the circuit board 10. As another example, when the reflective member 61 is formed of a metal material, it may be insulated from the metal layer L1 and the wiring layer L4 of the circuit board 10 through an insulating material.

The reflective member 61 may be coupled to the openings, and may contact the upper surface of the circuit board 10, for example, the protective layer L3. Accordingly, the reflective member 61 may contact the upper surface of the circuit board 10 and reflect light.

As in FIG. 10, the reflective member 61 may be disposed on an upper surface of the protective layer L3 of the circuit board 10. A width of a lower surface of the reflective member 61 may be identical to or less than a width W6 of the opening 62, but is not limited thereto.

As in FIG. 10, the lower portion 62 of the reflective member 61 may contact the protective layer L3, the insulating layer L2, and the metal layer L1 of the circuit board 10 within the openings 51, 52 and 53. The positions of the openings 51, 52 and 53 may be disposed in regions not vertically overlapped with the wirings of the circuit board 10. Accordingly, the occurrence of electrical shorts due to the reflective member 61 may be prevented.

The light emitting module may reduce variations in luminous flux, a color rendering index (CRI), and a correlated color temperature (CCT) of emitted white light. In addition, color uniformity may be improved, and differences in color senses may be reduced.

FIG. 11 is a view illustrating another example of the reflective member of FIG. 10.

Referring to FIG. 11, a reflective layer 61A may be disposed on the inside surface of the reflective member 61. The reflective layer 61A may contact the upper surface of the circuit board 10, for example, the protective layer L3, and may be disposed so as not to be electrically connected to the wiring parts within the circuit board 10. As another example, the reflective layer 61A may be spaced apart from or may be in a state of non-contact with the upper surface of the circuit board 10, for example, the protective layer L3.

FIG. 12 is a view illustrating a light emitting module according to a third embodiment as another example of the light emitting module of FIG. 9. FIG. 13 is a cross-sectional view of the light emitting module of FIG. 12, taken along line D-D.

Referring to FIG. 12 and FIG. 13, the light emitting module may include the light source unit 4 having the plurality of first to third light emitting devices 1A-1E, 2A-2D,3A, and 3B disposed on the circuit board 10, the reflective member 61 disposed in the circumference of the light source unit 4, and support protrusions 65 disposed within the reflective member 61.

The reflective member 61 may be coupled to the plurality of openings 51, 52 and 53 disposed in the circuit board 10. The reflective member 61 may contain a plastic material or a resin material such as silicon or epoxy. The reflective member 61 has a ring shape and may be disposed in the circumference of the light source unit 4. The reflective member 61 may have a circular shape or a polygonal shape when viewed from the top thereof.

The reflective member 61 may include a plurality of the support protrusions 65 therein. The plurality of support protrusions 65 may be disposed within the reflective member 61 to be spaced apart from each other.

A height of the support protrusions 65 may be identical to the height of the reflective member 61 and may be exposed outwardly. Through the outward exposure, heat radiation efficiency may be improved.

As another example, the support protrusions 65 may have a height lower than the height of the reflective member 61 and may be embedded in the reflective member 61. The support protrusions 65 are not exposed outwardly through the reflective member 61, whereby the penetration of moisture may be prevented.

The plurality of support protrusions 65 may be disposed on wiring regions of the first wiring part 21,22,23,24,25, and 26. The support protrusions 65 may be disposed to be vertically overlapped with the wirings of the third wiring part 35 and 36 of the circuit board 10. Accordingly, heat conducted from the third wiring part 35 and 36 of the circuit board 10 may be radiated.

A plurality of support protrusions 65 may be disposed on a single or plurality on three or more wirings of the first wiring part 21,22,23,24,25, and 26. For example, two or more protrusions 65 may be disposed on the second and third wirings 22 and 23 of the first wiring part 21,22,23,24, 25, and 26 disposed in the opposite side of connection terminals 11,12,13,14,15, and 16.

The plurality of support protrusions 65 may be formed of a material different from that of the reflective member 61, for example, a metal material. The support protrusions 65 may be formed of an aluminum material, a copper material, or a silver material, but are not limited thereto.

As in FIG. 13, a support protrusion 65 may be penetrated through a via hole 55 of the circuit board 10 and may be insulated from the metal layer L1 by an insulating material 56. The support protrusion 65 may not be electrically connected to the wiring layer L4 of the circuit board 10.

Since the plurality of support protrusions 65 are disposed on the first wiring part 21,22,23,24,25, and 26, heat emitted from the first light emitting devices 1A-1E connected to the first wiring part 21,22,23,24,25, and 26 may be effectively radiated. That is, the first light emitting devices 1A-1E having the highest heat-generation characteristics may be thermally protected.

FIG. 14 is another example of FIG. 13.

Referring to FIG. 14, the support protrusions 65 within the reflective member 61 may contact the wirings of the first wiring part 21,22,23,24,25, and 26, as in FIG. 12. Accordingly, heat conducted from the wirings of the first wiring part 21,22,23,24,25, and 26 may be radiated through the support protrusions 65. That is, a heat radiation surface area due to the wirings and the support protrusions 65 may be increased.

As another example, the support protrusions 65 within the reflective member 61 may not be in contact with the wirings of the first wiring part 21,22,23,24,25, and 26 and may contact the upper surface of the protective layer L3 of the circuit board 10. The support protrusions 65 may radiate heat conducted from the protective layer L3.

FIG. 15 is a view of a light emitting module according to a fourth embodiment.

Referring to FIG. 15, the light emitting module may include the light source unit 4 having a plurality of first light emitting devices 1A,1Aa,1B,1C,1D, and 1E and the second and third light emitting devices 2A-2D, 3A, and 3B disposed inwardly of the first light emitting devices 1A,1Aa,1B,1C, 1D, and 1E on the circuit board 10. The reflective member 61 according to the second embodiment may be disposed in the circumference of the light source unit 4.

The plurality of first light emitting devices 1A,1Aa,1B, 1C,1D, and 1E may be arranged in series, and may be disposed inwardly of the first virtual circle C1 along the first virtual circle C1.

The plurality of first light emitting devices 1A,1Aa,1B, 1C,1D, and 1E may be disposed such that opposite devices may face each other. For example, at least one pair of devices 1A and 1D, 1Aa and 1C, or 1B and E disposed in opposite sides, among the first light emitting devices 1A,1Aa,1B,1C,1D, and 1E, may face each other or may correspond to each other. That is, when an even number of the first light emitting devices are provided, pairs of devices may be disposed to face each other. Wirings of a first wiring part 21,22A,22,23,24,35, and 26 may connect the first to sixth devices 1A,1Aa,1B,1C,1D, and 1E to one another in series.

The plurality of first light emitting devices 1A,1Aa,1B, 1C,1D, and 1E may emit red light and may be disposed outwardly of the second and third light emitting devices 2A-2D,3A, and 3B. The second light emitting devices 2A-2D may emit green light and may be disposed in both sides of the third light emitting devices 3A and 3B. The third light emitting devices 3A and 3B may emit blue light and may be disposed inwardly of the first light emitting devices 1A,1Aa,1B,1C,1D, and 1E and the second light emitting devices 2A-2D.

FIG. 16 is a view of the light emitting module according to the fourth embodiment. In describing FIG. 16, the same portion as the embodiment disclosed above will be explained with reference to the description of the embodiment disclosed above.

Referring to FIG. 16, the light emitting module may include the circuit board 10 on which the light source unit 4 is disposed, and the reflective member 61 disposed in the circumference of the light source unit 4. The light emitting module may include the light-transmissive member 67 of FIG. 8.

The light source unit 4 may include the plurality of first light emitting devices 1A-1E, the plurality of second light emitting devices 2A-2D, and the plurality of third light emitting devices 3A and 3B.

The plurality of first light emitting devices 1A-1E may be connected to one another in series by the first wiring part 21,22,23,24,25, and 26. First and second connection terminals 11 and 11A connected to a connector (not shown) may be disposed in both terminals of the first wiring part 21,22, 23,24,25, and 26.

The plurality of second light emitting devices 2A-2D may be connected to one another in series by a second wiring part 31,32,33, and 34A. Third and fourth connection terminals 12A and 12B connected to the connector may be disposed in both terminals of the second wiring part 31,32,33, and 34A.

The plurality of third light emitting devices 3A and 3B may be connected to each other in series by a third wiring part 35A,35, and 36. Fifth and sixth connection terminals 13A and 13B connected to the connector may be disposed in both terminals of the third wiring part 35A,35, and 36.

Regions in which the wirings 21,22,23,24,25, and 26 of the first wiring part 21 to 26 are disposed may be provided in the outer circumference of the second wiring part 31,32, 33, and 34A. Here, the second wiring part 31,32,33, and 34A may exclude connection lines connected to the third and fourth connection terminals 12A and 12B.

Regions in which the wirings 21,22,23,24,25, and 26 of the first wiring part 21 to 26 are disposed may be provided in the outside of the third wiring part 35A,35, and 36. Here, the third wiring part 35A,35, and 36 may exclude connection lines connected to the fifth and sixth connection terminals 13A and 13B.

An output-side wiring of the first wiring part 21,22,23, 24,25, and 26 may be separated from an input-side wiring of the second wiring part 31,32,33, and 34A, and an output-side wiring of the second wiring part 31,32,33, and 34A may be separated from an input-side wiring of the third wiring part 35A,35, and 36.

The first to sixth connection terminals 11,11A,12A,12B, 13A, and 13B may control the supply of a current to the respective first to third light emitting devices 1A-1E, 2A-2D, 3A, and 3B so as to drive the light emitting devices 1A-1E, 2A-2D,3A, and 3B according to colors thereof.

The plurality of first light emitting devices 1A-1E may be disposed between the outside of the plurality of second and third light emitting devices 2A,2B,2C,2D,3A, and 3B, and the reflective member 61. The number of the plurality of first light emitting devices 1A-1E may be greater than the number of the second light emitting devices 2A-2D or the number of the third light emitting devices 3A and 3B.

The reflective member 61 may be disposed in the circumference of the plurality of first to third light emitting devices 1A-1E, 2A-2D,3A, and 3B, that is, in the circumference of the light source unit 4. The reflective member 61 may contain at least one of plastics or a resin material such as silicon or epoxy. A reflective layer formed of a metal material may be disposed on an inside surface of the reflective member 61. A plurality of support protrusions may be disposed within the reflective member 61, but are not limited thereto.

The reflective member 61 according to the embodiment may be coupled to the openings 51, 52 and 53 of the circuit board 10.

The plurality of support protrusions according to the embodiment may be coupled to the interior of the reflective member 61, but are not limited thereto.

FIG. 17 is a view of a light emitting module according to a fifth embodiment.

Referring to FIG. 17, the light emitting module may include the circuit board 10, the light source unit 4 according to the embodiment, disposed on the circuit board 10, the reflective member 61 disposed on the light source unit 4, the light-transmissive member 67 disposed within the reflective member 61, and a radiator 68 disposed under the circuit board 10. With regard to the circuit board 10, the light source unit 4 and the reflective member 61, please refer to the description disclosed in the aforementioned embodiment (s).

The light-transmissive member 67 may contain a transparent resin material such as silicon or epoxy. A phosphor may not be added in the light-transmissive member 67. As another example, a phosphor such as a yellow or red phosphor may be added in the light-transmissive member 67, but the light-transmissive member 67 is not limited thereto.

The light-transmissive member 67 may contact the upper surface of the circuit board 10 and the inside surface of the reflective member 61. The thickness of the light-transmissive member 67 may be identical to or higher than the height of the reflective member 61, but is not limited thereto. The upper surface of the light-transmissive member 67 may include at least one of a convex surface, a concave surface or a flat surface. The upper diameter of the light-transmissive member 67 may be wider than the lower diameter thereof, but is not limited thereto.

The radiator 68 may have one surface above which the light source unit 4 is disposed. Here, the one surface may be a flat surface or may be a surface having a predetermined curve.

A thickness of the radiator 68 may be thicker than that of the circuit board 10, and may be thinner than that of the light-transmissive member 67.

The radiator 68 may have heat radiation fins 68A. The heat radiation fins 68A may protrude or extend outwardly from one side of the radiator 68. A plurality of the heat radiation fins 68A may protrude in a direction opposite to a surface on which the circuit board 10 is disposed. The heat radiation fins 68A may broaden a heat radiation area of the radiator 68 to improve heat radiation efficiency of the light emitting module. A side-sectional shape of the heat radiation fin 68A may be a cylindrical shape, a polyprismatic shape, or a pillar shape in which a thickness of the heat radiation fin 68A is reduced in an outward direction.

The radiator 68 may be formed of a metal material or a resin material having excellent heat emission efficiency, but is not limited thereto. For example, a material of the radiator 68 may contain at least one of aluminum (Al), nickel (Ni), copper (Cu), silver (Ag), and tin (Sn).

FIG. 18 is a view illustrating a light unit having a light emitting module according to an embodiment.

Referring to FIG. 18, the light unit may include the circuit board 10, the light source unit 4 according to the embodiment (s), disposed on the circuit board 10, the reflective member 61 disposed in the circumference of the light source unit 4, the light-transmissive member 67 disposed within the reflective member 61, an optical member 69 disposed on the reflective member 61, and the radiator 68 disposed under the circuit board 10. With regard to the circuit board 10, the light source unit 4 and the reflective member 61, please refer to the description disclosed in the aforementioned embodiment (s).

The light-transmissive member 67 disposed within the reflective member 61 may not be formed, but is not limited thereto.

The optical member 69 may include at least one of a diffusion sheet, a horizontal and/or vertical prism sheet, and a brightness enhanced sheet. The diffusion sheet may diffuse incident light, the horizontal and/or vertical prism sheet may collect the incident light into an optional region, and the brightness enhanced sheet may reuse loss light to improve luminance.

The optical member 69 may contact the light-transmissive member 67 when the light-transmissive member 67 is present, but is not limited thereto. The light-transmissive member 67 may support the drooping of the optical member 69.

Although a width or an area of the optical member 69 is described in a structure in which the optical member 69 is disposed on a single light emitting module, the optical member 69 may be disposed on a plurality of light emitting modules when the plurality of light emitting modules are arranged, but is not limited thereto.

<Light Emitting Device>

FIG. 19 is a view illustrating an example in which a light emitting device is disposed on a circuit board according to an embodiment.

Referring to FIG. 19, a light emitting module may include the circuit board 10 and a light emitting device 40 on the circuit board 10. The light emitting device 40 may be one of the light emitting devices of the light source unit according to the embodiment, for example, one of the first to third light emitting devices.

The pads P1 and P2 of the circuit board 10 may be electrically connected to the light emitting device 40 by adhesion members 98 and 99.

The circuit board 10 may be a metal core PCB (MCPCB), a resin based PCB, or a flexible PCB (FPCB), but is not limited thereto.

The circuit board 10 may include, for example, the metal layer L1, the insulating layer L2, the wiring layer L4, and the protective layer L3, but is not limited thereto. The wiring layer L4 may include the pads P1 and P2.

The light emitting device 40 may include a body 90, a plurality of electrodes 92 and 93, a light emitting chip 94, a bonding member 95, and a molding member 97.

The body 90 may include one selected from an insulating material, a transmittance material and a conductive material. For example, the body 90 may be formed of at least one of a resin material such as polyphthalamide (PPA), silicon (Si), a metallic material, photo sensitive glass (PSG), sapphire (Al2O3), epoxy molding compound (EMC), polymer group, and a plastic based printed circuit board (PCB). For example, the body 90 may be formed of one selected from a resin material such as polyphthalamide (PPA), and a silicon or epoxy-based material. The body 90 may have a polygonal shape, a circular shape or a shape having a curved surface when viewed from the top, but the embodiment is not limited thereto.

The body 90 may include a cavity 91 which are provided with an opened upper portion and a peripheral portion having inclined surfaces. For example, at least two electrodes 92 and 93 may be disposed on a bottom surface of the cavity 91. The electrodes 92 and 93 may be spaced apart from each other on the bottom surface of the cavity 91. The cavity 91 may have a lower portion having a wider width than that of an upper portion, but the embodiment is not limited thereto.

The electrodes 92 and 93 may include a metallic material, for example, at least one of titanium (Ti), copper (Cu), nickel (Ni), gold (Au), chrome (Cr), tantalum (Ta), platinum (Pt), tin (Sn), silver (Ag), and phosphor (P), and may be configured as a single metal layer or multi-metal layers.

A gap part between the plurality of electrodes 92 and 93 may be formed of an insulating material which is equal to or different from that of the body 90, but the embodiment is not limited thereto.

The light emitting chip 94 may be disposed on at least one of the plurality of electrodes 92 and 93. The light emitting chip 94 may be bonded or flip-bonded to at least one of the electrodes 92 and 93 by using the bonding member 95. The bonding member 95 may include a paste material including silver (Ag).

The plurality of electrodes 92 and 93 may be electrically connected to the pads P1 and P2 of the wiring layer L4 of the circuit board 10 through the adhesion members 98 and 99.

The light emitting chip 94 may selectively emit light in the range between a visible light wavelength and an ultraviolet (UV) wavelength. For example, the light emitting chip 94 may be selected from a red LED chip, a blue LED chip, a green LED chip, a yellow green LED chip, a UV LED chip and a white LED chip. The light emitting chip 94 includes a compound semiconductor of group III-V elements and/or group II-VI elements. Although the light emitting chip 94 is disposed in a chip structure having a lateral type electrode structure in the embodiment, the light emitting chip 94 may disposed in a chip structure having a vertical type electrode structure in which two electrodes are disposed in a vertical direction. The light emitting chip 94 is electrically connected to the plurality of electrodes 92 and 93 through an electrical connection member such as a wire 96.

The light emitting device 40 may be a first light emitting device emitting red light, and in the first light emitting device, the light emitting chip 94 may be formed of a red LED chip or may include a UV LED chip and a red phosphor.

The light emitting device 40 may be a second light emitting device emitting green light, and in the second light emitting device, the light emitting chip 94 may be formed of a green LED chip or may include a UV LED chip and a green phosphor.

The light emitting device 40 may be a third light emitting device emitting blue light, and in the third light emitting device, the light emitting chip 94 may be formed of a blue LED chip or may include a UV LED chip and a blue phosphor.

One or two more of the light emitting chip 94 may be disposed in the cavity 91. At least two light emitting chips may be connected to each other in parallel or series, but the embodiment is not limited thereto.

The molding member 97 having a resin material may be formed in the cavity 91. The molding member 97 may include a transparent material such as silicon or epoxy and may be formed in a single layer or a multilayer structure. A top surface of the molding member 97 may include at least one of a flat shape, a concave shape and a convex shape. For example, the top surface of the molding member 97 may be concave or convex and may serve as a light emitting surface of the light emitting chip 94.

The molding member 97 may include phosphor for converting a wavelength of light emitted from the light emitting chip 94 which is included in a resin material such as silicon or epoxy. The phosphor may include one selected from YAG, TAG, silicate, nitride, and oxy-nitride-based materials. The phosphor may include at least one of a red phosphor, a yellow phosphor and a green phosphor, but the embodiment is not limited thereto.

An optical lens (not shown) may be provided on the molding member 97 and may be formed of a transparent material having a refractive index in the range of 1.4 to 1.7. In addition, the optical lens may include a transparent resin material such as poly methacrylic acid methyl (PMMA) having the refractive index of 1.49, polycarbonate having the refractive index of 1.59, and epoxy resin (EP), or a transparent glass.

FIG. 20 is a view illustrating a first modified example of a light emitting device of the light emitting module according to the embodiment.

Referring to FIG. 20, the light emitting module may include the circuit board 10 and a light emitting device 40A on the circuit board 10. The light emitting device 40A may be one of the light emitting devices of the light source unit according to the embodiment, for example, one of the first to third light emitting devices.

The pads P1 and P2 of the circuit board 10 may be electrically connected to the light emitting device 40A by adhesion members 161 and 162.

The circuit board 10 may be a metal core PCB (MCPCB), a resin based PCB, or a flexible PCB (FPCB), but is not limited thereto.

The light emitting device 40A may include a substrate 111, a first semiconductor layer 113, a light emitting structure 120, an electrode layer 131, an insulating layer 133, a first electrode 135, a second electrode 137, a first connection electrode 141, a second connection electrode 143, and a support layer 140.

The substrate 111 may use a light transmittable, insulating, or conductive substrate. For example, the substrate 111 may use at least one of sapphire ($Al_2O_3$), SiC, Si, GaAs, GaN, ZnO, GaP, InP, Ge, and $Ga_2O_3$. The substrate 111 may be defined as a growth substrate on which semiconductor layers are stacked. A plurality of convex portions (not shown) may be formed on at least one or all of a top surface and a bottom surface of the substrate 111 to improve light extraction efficiency. A side cross-sectional shape of each convex portion may include at least one of a hemispherical shape, a half-oval shape, or a polygonal shape. Here, the substrate 111 may be removed in the light emitting device 40A, and in this case, the first semiconductor layer 113 or a first conductive semiconductor layer 115 may be disposed as a top layer of the light emitting device 40A.

The first semiconductor layer 113 may be formed below the substrate 111. The first semiconductor layer 113 may be formed using II-V compound semiconductors. The first semiconductor layer 113 may be formed as at least one layer or a plurality of layers using the II-V compound semiconductors. The first semiconductor layer 113 may have the semiconductor layer using III-V compound semiconductors that include at least one of GaN, InN, AlN, InGaN, AlGaN, InAlGaN, AlInN, AlGaAs, GaAs, GaAsP, AlGaInP, and GaP. The first semiconductor layer 113 may have an empirical formula, $In_xAl_yGa_{1-x-y}N$ ($0 \le x \le 1$, $0 \le y \le 1$, $0 \le x+y \le 1$), and may be formed of at least one of a buffer layer and an undoped semiconductor layer. The buffer layer may reduce a difference of lattice constants between the substrate and a nitride semiconductor layer, and the undoped semiconductor layer may improve a crystal quality of a semiconductor. Here, the first semiconductor layer 113 may not be formed.

The light emitting structure 120 may be formed below the first semiconductor layer 113. The light emitting structure 120 may be selectively formed from II-V and III-V compound semiconductors, and emit a predetermined peak wavelength within a wavelength range from an ultraviolet band to a visible ray band.

The light emitting structure 120 includes the first conductive semiconductor layer 115, a second conductive semiconductor layer 119, and an active layer 117 formed between the first conductive semiconductor layer 115 and the second conductive semiconductor layer 119. Another semiconductor layer may be further disposed on at least one of above or below each of the layers 115, 117, and 119, but embodiments are not limited thereto.

The first conductive semiconductor layer 115 may be disposed below the first semiconductor layer 113, and be implemented with a semiconductor to which a first conductive dopant is doped, e.g. an n-type semiconductor layer. The first conductive semiconductor layer 115 includes the empirical formula, $In_xAl_yGa_{1-x-y}N$ ($0 \leq x \leq 1$, $0 \leq y \leq 1$, $0 \leq x+y \leq 1$). A material of the first conductive semiconductor layer 115 may be selected from III-V compound semiconductors such as GaN, AlN, AlGaN, InGaN, InN, InAlGaN, AlInN, AlGaAs, GaP, GaAs, GaAsP, and AlGaInP. The first conductive dopant is an n-type dopant which includes dopants such as Si, Ge, Sn, Se, and Te.

The active layer 117 is disposed below the first conductive semiconductor layer 115, selectively includes a single quantum well, a multiple quantum well (MQW), a quantum wire structure, or a quantum dot structure, and includes periods of a well layer and a barrier layer. The periods of the well layer/barrier layer include at least one among pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second conductive semiconductor layer 119 is disposed below the active layer 117. The second conductive semiconductor layer 119 includes, for example, the empirical formula, $In_xAl_yGa_{1-x-y}N$ ($0 \leq x \leq 1$, $0 \leq y \leq 1$, $0 \leq x+y \leq 1$). The second conductive semiconductor layer 119 may be formed of at least one compound semiconductor of GaN, InN, AlN, InGaN, AlGaN, InAlGaN, AlInN, AlGaAs, GaP, GaAs, GaAsP, and AlGaInP.

The second conductive semiconductor layer 119 is a p-type semiconductor layer, and the first conductive dopant is a p-type dopant, the may include Mg, Zn, Ca, Sr, and Ba.

As another example, in the light emitting structure 120, the first conductive semiconductor layer 115 may be implemented using a p-type semiconductor layer, and the second conductive semiconductor layer 119 may be implemented using an n-type semiconductor layer. A third conductive semiconductor layer having opposite polarity from the second conductive semiconductor layer 119 may be formed on the second conductive semiconductor layer 119. Also, the light emitting structure 120 may be implemented using any one structure among an n-p binding structure, a p-n binding structure, an n-p-n binding structure, and a p-n-p binding structure.

The electrode layer 131 is formed below the second conductive semiconductor layer 119. The electrode layer 131 may include a reflective layer. The electrode layer 131 may include an ohmic contact layer coming in contact with the second conductive semiconductor layer 119 of the light emitting structure 120. A material of the reflective layer may be selected from a material with a reflection rate of 70% or greater, e.g. metals of Al, Ag, Ru, Pd, Rh, Pt, Ir and alloys of two or more of the above metals. The metal of the reflective layer may be in contact below the second conductive semiconductor layer 119. A material of the ohmic contact layer may be selected from a light transmittable material, and a metal or nonmetal material.

The electrode layer 131 may include a stacked structure of a light transmittable electrode layer/reflective layer, and the light transmittable electrode layer may be formed of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), AZO, antimony tin oxide (ATO), GZO, Ag, Ni, Al, Rh, Pd, Ir, Ru, Mg, Zn, Pt, Au, Hf and materials formed of selective combinations of the above. A metallic reflective layer may be disposed below the light transmittable electrode layer, and may be formed of Ag, Ni, Al, Rh, Pd, Ir, Ru, Mg, Zn, Pt, Au, Hf, and materials formed of selective combinations of the above. As another example, the reflective layer may be formed of a distributed Bragg reflection (DBR) structure in which two layers having different refraction rates are alternately disposed.

A light extraction structure such as roughness may be formed at a surface of at least one layer of the second conductive semiconductor layer 119 and the electrode layer 131, and the light extraction structure may change a critical angle of incident light to improve the light extraction efficiency.

The insulating layer 133 may be disposed below the electrode layer 131, and may be disposed at a lower surface of the second conductive semiconductor layer 119, side surfaces of the second conductive semiconductor layer 119 and the active layer 117, and a partial region of the first conductive semiconductor layer 115. The insulating layer 133 is formed at the lower region of the light emitting structure 120 except the electrode layer 131, the first electrode 135, and the second electrode 137 to electrically protect the lower portion of the light emitting structure 120.

The insulating layer 133 includes an insulating material or an insulating resin formed with at least one of an oxide, a nitride, a fluoride, and a sulfide having at least one of Al, Cr, Si, Ti, Zn, and Zr. For example, the insulating layer 133 may be selectively formed of SiO2, Si3N4, Al2O3, or TiO2. The insulating layer 133 may be formed as a single layer or multiple layers, but embodiments are not limited thereto. The insulating layer 133 is formed to prevent an interlayer shortage in the light emitting structure 120 when forming a metallic structure for bonding below the light emitting structure 120.

The insulating layer 133 may be formed of a DBR structure in which a first layer and a second layer having different refraction rates are alternately disposed. The first layer may be formed with any one of $SiO_2$, $Si_3N_4$, $Al_2O_3$, and $TiO_2$, and the second layer may be formed with any one material other than the material of the first layer, but embodiments are not limited thereto. Also, the first layer and the second layer may be formed with the same material or formed of a pair having three or more layers. In this case, the electrode layer may not be formed.

The first electrode 135 may be disposed below the partial region of the first conductive semiconductor layer 115, and the second electrode 137 may be disposed below a portion of the electrode layer 131. The first connection electrode 141 is disposed below the first electrode 135, and the second connection electrode 143 is disposed below the second electrode 137.

The first electrode 135 may be electrically connected to the first conductive semiconductor layer 115 and the first connection electrode 141, and the second electrode 137 may be electrically connected to the second conductive semiconductor layer 119 and the second connection electrode 143.

The first electrode 135 and the second electrode 137 may be formed with at least one of Cr, Ti, Co, Ni, V, Hf, Ag, Al, Ru, Rh, Pt, Pd, Ta, Mo, W or alloys thereof, and may be formed as a single layer or multiple layers. The first electrode 135 and the second electrode 137 may be formed with the same stacked structure or different staked structures. A current spreading pattern such as an arm or finger structure may be further formed on at least one of the first electrode 135 and the second electrode 137. Also, one or a plurality of the first electrodes 135 and the second electrodes 137 may be formed, and the numbers of the first electrodes 135 and the second electrodes 137 are not limited. At least one of the first and second connection electrodes 141 and 143 may be disposed in a plurality, but embodiments are not limited thereto.

The first connection electrode 141 and the second connection electrode 143 provide a lead function of supplying power and a radiation path. Shapes of the first connection electrode 141 and the second connection electrode 143 may include at least one of a circular shape, a polygonal shape, a cylindrical shape, and a polygonal prism shape. The first connection electrode 141 and the second connection electrode 143 may be formed with any one of Ag, Al, Au, Cr, Co, Cu, Fe, Hf, In, Mo, Ni, Si, Sn, Ta, Ti, W, and selective alloys of the above metals. The first connection electrode 141 and the second connection electrode 143 may be plated with any one metal of In, Sn, Ni, Cu, and selective alloys thereof to improve an adhesive force with the first electrode 135 and the second electrode 137.

The support layer 140 may include a thermally conductive material, and be disposed at circumferences of the first electrode 135, the second electrode 137, the first connection electrode 141, and the second connection electrode 143. Lower surfaces of the first and second connection electrodes 141 and 143 may be exposed to a lower surface of the support layer 140.

The support layer 140 is used as a layer for supporting the light emitting device 40A. The support layer 140 is formed of an insulating material, and the insulating material is formed with a resin layer such as silicone resin or epoxy resin. As another example, the insulating material may include a paste or an insulating ink. The insulating material may be formed with a resin including polyacrylate resin, epoxy resin, phenolic resin, polyamides resin, polyimides resin, unsaturated polyesters resin, polyphenylene ether resin (PPE), polyphenilene oxide (PPO) resin, polyphenylenesulfides resin, cyanate ester resin, benzocyclobutene (BCB), polyamido-amine (PAMAM) dendrimers, and polypropylene-imine (PPI) dendrimers, and PAMAM inner structures and PAMAM-organosilicon (OS) having an organic silicon outer surface solely or in combinations thereof. The support layer 140 may be formed with a different material from the insulating layer 133.

At least one of compounds such as an oxide, a nitride, a fluoride, and a sulfide having at least one of Al, Cr, Si, Ti, Zn, and Zr may be added into the support layer 140. Here, the compound added into the support layer 140 may be a heat diffusing agent, and the heat diffusing agent may be used as powder particles of a predetermined size, a grain, filler, and an additive. The heat diffusing agent includes a ceramic material, and the ceramic material includes at least one of low temperature co-fired ceramic (LTCC), high temperature co-fired ceramic (HTCC), alumina, quartz, calcium zirconate, forsterite, SiC, graphite, fused silica, mullite, cordierite, zirconia, beryllia, and aluminum nitride. The ceramic material may be formed with a metal nitride, which has higher thermal conductivity than a nitride or an oxide, among insulating materials such as the nitride or the oxide, and the metal nitride may include, for example, a material with the thermal conductivity of 140 W/mK or greater. The ceramic material may be ceramic series such as $SiO_2$, $Si_xO_y$, $Si_3N_4$, SixNy, SiOxNy, $Al_2O_3$, BN, SiC(SiC—BeO), BeO, CeO, and AlN. The thermal conductive material may include a C component (diamond, carbon nanotube (CNT)).

The first and second connection electrodes 141 and 143 of the light emitting device 40A may be mounted on the pads P1 and P2 disposed on the circuit board 10 by the adhesion members 161 and 162. A protective layer (not shown) may be disposed on the upper surface of the circuit board 10. The protective layer may contain a reflective material and for example, may be formed of a resist material such as a white resist material but the embodiment is not limited thereto.

FIG. 21 is a view illustrating a second modified example of a light emitting device of the light emitting module according to the embodiment.

Referring to FIG. 21, the light emitting module may include the circuit board 10 and a light emitting device 40B on the circuit board 10. The light emitting device 40B may be one of the light emitting devices of the light source unit according to the embodiment, for example, one of the first to third light emitting devices.

The light emitting device 40B may include the substrate 111, the first semiconductor layer 113, the light emitting structure 120, the electrode layer 131, the insulating layer 133, the first electrode 135, the second electrode 137, the first connection electrode 141, the second connection electrode 143, and the support layer 140. The substrate 111 and the first semiconductor layer 113 may be removed.

The light emitting device 40B and the circuit board 10 may be connected to each other by the connection electrodes 161 and 162. The pads P1 and P2 of the circuit board 10 may be adhered to the light emitting device 40B by the connection electrodes 161 and 162.

The connection electrodes 161 and 162 may include a conductive pump, that is, a solder pump. A single connection electrode 161 or 162 or a plurality of connection electrodes 161 and 163 may be arranged below the respective electrodes 135 and 137 but the embodiment is not limited thereto. The insulating layer 33 may expose the first and second electrodes 135 and 137, and the connection electrodes 161 and 162 may connect the first and second electrodes 135 and 137, and the pads P1 and P2 of the circuit board 10.

FIG. 22 is a view illustrating a third modified example of a light emitting device of the light emitting module according to the embodiment.

Referring to FIG. 22, the light emitting module may include the circuit board 10 and a light emitting device 40C on the circuit board 10. The light emitting device 40C may be one of the light emitting devices of the light source unit according to the embodiment, for example, one of the first to third light emitting devices.

The circuit board 10 may be a metal core PCB (MCPCB), a resin based PCB, or a flexible PCB (FPCB), but is not limited thereto.

The light emitting device 40C may be connected to the circuit board 10. The light emitting device 40C includes a light emitting structure 225 and a plurality of electrodes 245 and 247. The light emitting structure 225 may be formed with II-VI compound semiconductor layers, e.g. III-V compound semiconductor layers or II-VI compound semiconductor layers. The plurality of electrodes 245 and 247 are selectively connected to the semiconductor layer of the light emitting structure 225 to supply power.

The light emitting structure 225 includes a first conductive semiconductor layer 222, an active layer 223, and a second conductive semiconductor layer 224. The light emitting device 40C may include a substrate 221. The substrate 221 is disposed on the light emitting structure 225. The substrate 221 may be, for example, a light transmittable, insulating substrate, or a conductive substrate.

The electrodes 245 and 247 are disposed on a lower portion of the light emitting device 40C, and the electrodes 245 and 247 include first and second electrodes 245 and 247. The first and second electrodes 245 and 247 are disposed apart from each other below the light emitting device 40C. The first electrode 245 is electrically connected to the first conductive semiconductor layer 222, and the second electrode 247 is electrically connected to the second conductive semiconductor layer 224. Shapes of bottoms of the first and second electrodes 245 and 247 may be polygonal or circular shapes, or formed to correspond to the shapes of pads P1 and P2 of the circuit board 10. A lower surface area of each of the first and second electrodes 245 and 247 may be formed in sizes corresponding to those of an upper surface of each of first and second electrodes 415 and 417.

The light emitting device 40C may include at least one of a buffer layer (not shown) and an undoped semiconductor layer (not shown) between the substrate 221 and the light emitting structure 225. The buffer layer is a layer for mitigating a difference between lattice constants of the substrate 221 and the semiconductor layer, and may be selectively formed of II-VI compound semiconductors. An undoped III-V compound semiconductor layer may be further formed below the buffer layer, but embodiments are not limited thereto. The substrate 221 may be removed. When the substrate 221 is removed, an upper surface of the first conductive semiconductor layer 222 or an upper surface of another semiconductor layer may be exposed.

The light emitting device 40C includes first and second electrode layers 241 and 242, a third electrode layer 243, and insulating layers 231 and 233. Each of the first and second electrode layers 241 and 242 may be formed as a single layer or multiple layers, and may function as a current spreading layer. The first and second electrode layers 241 and 242 may include a first electrode layer 241 disposed below the light emitting structure 225 and a second electrode layer 242 disposed below the first electrode layer 241. The first electrode layer 241 spreads current and the second electrode layer 242 reflects incident light.

The first and second electrode layers 241 and 242 may be formed of different materials. The first electrode layer 241 may be formed of light transmittable material, e.g. a metal oxide or a metal nitride. The first electrode layer may be selectively formed from ITO, ITO nitride (ITON), IZO, IZO nitride (IZON), IZTO, IAZO, IGZO, IFTO, AZO, ATO, and GZO. The second electrode layer 242 may come in contact with a lower surface of the first electrode layer 241 and function as a reflective electrode layer. The second electrode layer 242 includes, for example, Ag, Au, or Al. When a partial region of the first electrode layer 241 is removed, the second electrode layer 242 may partially come in contact with the lower surface of the light emitting structure 225.

As another example, the first and second electrode layers 241 and 242 may be stacked with an omni-directional reflector (ODR) layer. The ODR structure may be formed with a stacked structure of the first electrode layer 241 having a low refraction rate and the second electrode layer 242 which is a highly reflective metal material coming in contact with the first electrode layer 241. The first and second electrode layers 241 and 242 may be formed with a stacked structure of ITO/Ag. An omni-directional reflection angle may be improved at an interface between the first electrode layer 241 and the second electrode layer 242.

As another example, the second electrode layer 242 may be removed, and may be formed as a reflective layer of another material. The reflective layer may be formed using the DBR structure. The DBR structure includes a structure in which two dielectric layers having different refraction rates are alternately disposed, and may include, for example, any different one among an $SiO_2$ layer, an $Si_3N_4$ layer, a $TiO_2$ layer, an $Al_2O_3$ layer, and an MgO layer. As still another example, the electrode layers 241 and 242 may include both the DBR structure and the ODR structure, and in this case, the light emitting device 40C having a light reflection rate of 98% or greater may be provided. Since light reflected from the second electrode layer 242 is emitted through the substrate 221 in the light emitting device 40C mounted using the flip method, most light may be emitted vertically upward.

The third electrode layer 243 is disposed below the second electrode layer 242, and is electrically insulated with the first and second electrode layers 241 and 242. The third electrode layer 243 includes at least one metal of Ti, Cu, Ni, Au, Cr, Ta, Pt, Sn, Ag, and P. The first electrode 245 and the second electrode 247 are disposed below the third electrode layer 243. The insulating layers 231 and 233 block unnecessary contacts between the first and second electrode layers 241 and 242, the third electrode layer 243, the first and second electrodes 245 and 247, and the light emitting structure 225. The insulating layers 231 and 233 include first and second insulating layers 231 and 233. The first insulating layer 231 is disposed between the third electrode layer 243 and the second electrode layer 242. The second insulating layer 233 is disposed between the third electrode layer 243 and the first electrode 245 or the second electrode 247. The first and second electrodes 245 and 247 may include the same material as the pads P1 and P2.

The third electrode layer 243 is connected to the first conductive semiconductor layer 222. A connection portion 244 of the third electrode layer 243 may protrude as a via structure through the lower portion of the light emitting structure 225, and may come in contact with the first conductive semiconductor layer 222. The connection portion 244 may be disposed in a plural number. A portion 232 of the first insulating layer 231 extends along a circumference of the connection portion 244 to block electrical connections between the third electrode layer 243 and the first and second electrode layers 241 and 242, and the second conductive semiconductor layer 224 and the active layer 223. An insulating layer may be disposed at a side surface of the light emitting structure 225 for side surface protection, but embodiments are not limited thereto.

The second electrode 247 is disposed below the second insulating layer 233, and comes in contact or is connected to at least one of the first and second electrode layers 241 and 242 through an open region of the second insulating layer 233. The first electrode 245 is disposed below the second insulating layer 233 and connected to the third electrode layer 243 through the open region of the second insulating layer 233. Consequently, a protrusion 248 of the first pad 247 is electrically connected to the second conductive semiconductor layer 224 through the first and second electrode layers 241 and 242, and a protrusion 246 of the second pad 248 is electrically connected to the first conductive semiconductor layer 222 through the third electrode layer 243.

The first and second electrodes 245 and 247 are spaced apart from each other at the lower portion of the light emitting device 40C, and face the pads P1 and P2 of the circuit board 10. The first and second electrodes 245 and 247 may include recesses 271 and 273 of polygonal shapes, and the recesses 271 and 273 are convexly formed toward the light emitting structure 225. The recesses 271 and 273 may be formed with depths which are the same or smaller than the thicknesses of the first and second electrodes 245 and 247, and the depths of the recesses 271 and 273 may increase surface areas of the first and second electrodes 245 and 247.

Bonding members 255 and 257 are respectively disposed in a region between the first electrode 245 and the first pad P1 and a region between the second electrode 247 and the second pad P2. The bonding members 255 and 257 may include an electrical conductive material, and have a portion disposed at the recesses 271 and 273. Since the bonding members 255 and 257 are disposed at the recesses 271 and 273, contact areas between the bonding members 255 and 257 and the first and second electrodes 245 and 247 may increase. Consequently, since the first and second electrodes 245 and 247 and the first and second pads P1 and P2 are bonded to each other, electrical reliability and radiation efficiency of the light emitting device 40C may be improved.

The bonding members 255 and 257 may include a solder paste material. The solder paste material includes at least one of Au, Sn, Pb, Cu, Bi, In, and Ag. Since the bonding members 255 and 257 directly conduct heat to the circuit board 10, the thermal conduction efficiency may be improved compared to a structure using a package. Also, since the bonding members 255 and 257 are materials having small differences in thermal expansion coefficients with the first and second electrodes 245 and 247, the thermal conduction efficiency may be improved.

As another example, the bonding members 255 and 257 may include a conductive film, and the conductive film includes one or more conductive particles within an insulating film. The conductive particles may include at least one of a metal, a metal alloy, or carbon, for example. The conductive particles may include at least one of Ni, Ag, Au, Al, Cr, Cu, and C. The conductive film may include an anisotropic conductive film or an anisotropic conductive adhesive agent.

An adhesive member, e.g. a thermally conductive film, may be included between the light emitting device 40C and the circuit board 10. The thermally conductive film may use a polyester resin such as polyethylene terephthalate, polybutylene terephthalate, polyethylene naphthalate, and polybutylene naphthalate, a polyimide resin, an acrylic resin, a styrene-based resin such as polystyrene resin and acrylonitrile-styrene resin, a polycarbonate resin, a polylactic resin, and a polyurethane resin. Also, the thermally conductive film may include at least one of a polyolefin resin such as polyethylene, polypropylene, and ethylene-propylene copolymers, a vinyl resin such as polyvinyl chloride resin and polyvinylidene chloride resin, a polyamide resin, a sulfon-based resin, a polyether-ether ketone based resin, an arylate-based resin, or blends of the above resins.

The light emitting device 40C may emit light through a surface of the circuit board 10 and side surfaces and an upper surface of the light emitting structure 225 to improve the light extraction efficiency. The light emitting device 40C may be directly bonded on the circuit board 10, thereby simplifying the process. Also, as the radiation of the light emitting device 40C is improved, the light emitting device 40C may be usefully used in the lighting field.

<Lighting Apparatus>

FIG. 23 is a view illustrating a lighting apparatus having a light emitting module according to an embodiment, FIG. 24 is a view illustrating a lighting control method of a lighting apparatus having a light emitting module according to an embodiment, FIG. 25 is a view illustrating the color temperature of light which can be emitted from a lighting apparatus according to the embodiment as a CIE 1931 chromaticity diagram, FIG. 26 is a CIE 1931 chromaticity diagram in which A shown in FIG. 25 is enlarged, and FIG. 27 is a view illustrating an example of chromaticity control on a CIE 1931 chromaticity diagram of FIG. 26 in a lighting apparatus according to the embodiment.

Referring to FIG. 23, a lighting apparatus includes a light emitting module 100, a control unit 510 for controlling the light emitting module 100, a memory part 520 for storing control information of the light emitting module 100, a driver 530 for controlling driving of the light emitting module 100.

The light emitting module 100 may include a light source unit 4 disclosed in the embodiment and a heat sensing unit 5 outside the light source unit 4, but the present invention is not limited thereto.

The light source unit 4 refers to a light source unit 4 shown in FIGS. 1 to 18, and for example, may include a first light source unit 4A having the plurality of first light emitting devices 1A-1E, a second light source unit 4B having the plurality of second light emitting devices 2A-2D, and a third light source unit 4C having the plurality of third light emitting devices 3A and 3B.

At a periphery of the light source 4, a reflective member 65 disclosed in an embodiment of FIGS. 8 to 16 may be included, and in an upper part of the light source unit 4, an optical sheet 69 of FIG. 18 described above may include, for example, a diffusion sheet. Light emitted from the light source unit 4 is mixed to emit white light, is reflected from the reflective member 65, and may be mixed in a mixing space in the reflective member 65 and then exited to an outside through the optical sheet 69.

A correlated color temperature (CCT) of light which can be emitted from a light emitting module 100 according to an embodiment is located between 2700K and 6500K as shown in FIG. 25. A CRI of light emitted from the light emitting module 100 according to the embodiment may be 88 or more, for example, the CRI may be 90 or more. When a CRI is greater than 90, the correlated color temperature of light which can be emitted from the light emitting module 100 according to the embodiment may be located between 2700K and 5700K.

The first light source unit 4A of the light emitting module 100 may be driven by a first current signal $I_R$ of a first driving unit 531 of the driver 530, the second light source unit 4B may be driven by a second current signal $I_G$ of a second driving unit 532 of the driver 530, and the third light source unit 4C may be driven by a second current signal $I_B$ of a third driving unit 533 of the driver 530. The light emitting module 100 may drive the first to third light source units 4A, 4B and 4C by the first to third current signals $I_R$, $I_G$, and $I_B$ of the driver 530. The light emitting module 100 may emit white light having a predetermined CCT by driving the first to third light source units 4A, 4B, and 4C.

The control unit 510 transmits first to third current control signals $D_R$, $D_G$, and $D_B$ to the first to third drivers 531, 532, and 533 of the driver 530 so that white light emitted from the light source unit 4 becomes white light having a predetermined CCT.

The first to third current control signals $D_R$, $D_G$, and $D_B$ may be an intensity value of an input current to the first to third light source units 4A, 4B and 4C so that the white light having the predetermined CCT is emitted. The first to third current control signals $D_R$, $D_G$, and $D_B$ may be a pulse width modulation (PWM) signal, an amplitude modulation signal, or an analog-type signal. In an embodiment of the present invention, the description will be limited to the PWM signal.

The first to third driving units 531, 532, and 533 of the driver 530 generate the first to third current control signals $D_R$, $D_G$, and $D_B$ of the control unit 510, for example, a driving current corresponding to a PWM signal, which are then output to the first to third light source units 4A, 4B and 4C. That is, the driver 530 generates drive currents having different current intensities for each time period in order to produce a natural light atmosphere during the morning, lunch, or evening.

The memory part 520 stores compensation data 521 and a lookup table 522. The memory part 520 may be an electrically erasable programmable read-only memory (EEPROM).

The compensation data 521 may be optical characteristics of each light emitting module, for example, an intensity value of the input current in which white light of each light emitting module 100 may be chromaticity coordinates which is a reference for each predetermined CCT.

In the lookup table 522, intensity values of input currents of the first to third light source units 4A, 4B and 4C are stored so that white light having a predetermined CCT for each temperature sensed from the light emitting module 100 is emitted.

The control unit 510 outputs the first to third current control signals $D_R$, $D_G$, and $D_B$ corresponding to intensity values of input currents of the first to third light source units 4A, 4B, and 4C to the driver 530 for compensating or emitting white light as a reference for each predetermined CCT, by referring to the compensation data 521 of the memory part 520.

The control unit 510 outputs the first to third current control signals $D_R$, $D_G$, and $D_B$, which are intensity values of an input current corresponding to the predetermined CCT, which are generated by referring to a lookup table 522 of the memory part 520, to first to third driving unit $D_R$, $D_G$, and $D_B$ of the driver 530.

In the lookup table 522, a ratio of a reference current value corresponding to the CCT required depending on an operation mode or a user's selection is stored in advance. A ratio of the reference current values may be experiment data previously measured by a designer.

As another example, the lookup table 522 may store an intensity value of an input current which can compensate for a chromaticity change depending on a temperature characteristic of each light emitting module 100. That is, in the lookup table 522, an intensity value of an input current may be stored in order to compensate white light emitted from the first to third light sources 4A, 4B and 4C with predetermined white light depending on the temperature change.

As a temperature of white light emitted from the light emitting module 100 increases, the color coordinates may be shifted. Accordingly, the control unit 510 transmits the first to third current control signals $D_R$, $D_G$, and $D_B$ to the driver 530 after detecting a value of an input current depending on temperature data sensed by a heat sensing device 5 of the light emitting module 100, by referring to the lookup table 522 of the memory part 520.

Here, the controller 510 may control the white light emitted from the light emitting module 100 to emit white light having a predetermined CCT value, by referring to the lookup table 522 depending on a shift of color coordinates according to the temperature as well as compensation data 521 for each CCT of white light of a light emitting module 100.

Referring to FIG. 23, when a lighting control method of a lighting apparatus according to the embodiment with respect to FIG. 24 is described, compensation data for each light emitting module in an embodiment is obtained in advance. For this, during a manufacturing process of a light emitting module 100, the light emitting module 100 is driven with an input current value depending on an arbitrary CCT in step S1, and chromaticity data corresponding to luminous fluxes of red, green, and blue light emitted from the driven light emitting module 100 are detected. A deviation value between the detected chromaticity data of the CCT and the reference chromaticity data for each CCT is calculated in step S2, and a compensated value of the calculated deviation value may be the compensation data 521. That is, the compensation data 521 may be a value of an input current that compensates for a difference between predetermined reference chromaticity data for each CCT and chromaticity data detected from the light emitting module 100. In an embodiment, when the light emitting module 100 is set, deviation of chromaticity data for each CCT depending on luminous flux characteristics of different light emitting modules 100 is detected in advance, and compensation data 521 compensating for the chromaticity data is stored in the memory part 520 in step S3.

For example, as shown in FIG. 27, chromaticity coordinates by a luminous flux emitted from the light emitting module 100 at an arbitrary CCT, for example, are detected as first coordinate values T1 at 2700K. When reference chromaticity coordinates are the first coordinate values T1, an intensity value of the input current of the chromaticity data is controlled so that a deviation between second coordinate values T2 and the first coordinate values T1 may be eliminated. Controlling of an intensity value of an input current at this moment may be controlled by adding or subtracting an input current ratio and a peak value of an input current. When the chromaticity coordinates at which the second coordinate values T2 as a reference of an arbitrary CCT are shifted to the first coordinate values T1 are detected after the control process, the intensity value of the input current at this moment is stored as compensation data 521 for each CCT in which white light corresponding to the CCT may be emitted.

When the compensation data 521 is stored in the memory part 520, the control unit 510 controls driving by an input current intensity value of a light emitting module 100 based on the compensation data 521 in step S4.

Then, when a temperature is sensed from the heat sensing unit 5 in step S5, the control unit 510 loads the input current value corresponding to the sensed temperature with reference to the lookup table 522. Then, the controller 510 controls an input current value of the light emitting module 100 so as to be shifted to reference white light for each CCT (M2 in FIG. 27) at step S6 by using the lookup table 522 and the compensation data 521 for each CCT.

The control unit 510 may control white light having the predetermined CCT value to be emitted by referring to the lookup table depending on the temperature change and compensation data by white light emitted from the light emitting module 100.

Referring to FIG. 26, a color temperature of light which can be emitted from the lighting apparatus according to an embodiment may be disposed on or very close to a black body locus like a 'CCT Tunable' line, and thus a CRI is high because a color temperature of light that may be emitted from the lighting apparatus according to an embodiment is disposed at or very close to the Ansi center. In addition, a chromaticity value of light emitted from the light emitting module 100 may be emitted as white light present in a limited region of the blackbody locus on the CIE-1931 chart.

Further, the first to third light source units 4A, 4B, and 4C which emit red, green, and blue light are combined, and thus it can be confirmed that white light capable of maintaining a CRI of 90 or more, preferably 95 can be realized. Further, it can be confirmed that white light having a CCT in the range of 3500K to 6500K can be realized.

A lighting apparatus according to the embodiment may be provided with a plurality of lighting modules. For example, a plurality of light emitting modules as shown in FIGS. 17 and 18 may be disposed. Each of the plurality of light emitting modules may include first to third light source units that emit different colors. Luminous fluxes among the first to third light source units provided in each of the light emitting modules may be different from each other. For example, luminous fluxes among red light emitting devices, among green light emitting devices, or among blue light emitting devices provided in first to third light emitting modules may be different from each other, and in this case, color tones of white light emitted from different light emitting modules may be different from each other. A color tone deviation may occur among red, green, and blue light emitting devices, and thus a uniform color tone may not be obtained.

As a lighting apparatus for reducing the luminous flux difference between light emitting devices for each of the same colors of these different light emitting modules, descriptions of FIGS. 28 and 29 will be referred to.

FIG. 28 is a lighting apparatus having a plurality of light emitting modules according to an embodiment, and FIG. 29 is a flowchart illustrating a lighting control method of the lighting apparatus of FIG. 28. In describing FIG. 28, the components described in the above embodiments are denoted by the same reference numerals and will be described.

Referring to FIG. 28, a lighting apparatus includes: a control unit 510; a plurality of light emitting modules 100A, 100B, and 100C each having light source units 4 (4A, 4B, and 4C); a memory part 520 in which control information of the light emitting modules 100A, 100B, and 100C is stored; a plurality of drivers 530A, 530B, and 530C each having a plurality of driving units 531, 532, and 533.

The light emitting module 100A, 100B, or 100C may be a light emitting module having a light source unit 4 disclosed in an embodiment and a heat sensing unit 5 outside the light source unit 4, but the present invention is not limited thereto.

The light source unit 4 may include a light source unit 4 shown in FIGS. 1 to 18, for example, a first light source unit 4A having the plurality of first light emitting devices 1A-1E, a second light source unit 4B having the plurality of second light emitting devices 2A-2D, and a second light source unit 4C having the plurality of third light emitting devices 3A and 3B. The first light emitting devices 1A-1E emit a red light, and the second light emitting devices 2A-2D emit a green light, and the third light emitting devices 3A and 3B emit a blue light. A reflective member 65 shown in an embodiment of FIGS. 8 to 16 may be included at a periphery of each of the light source units 4.

On top of each of the light source unit 4, an optical sheet (69 in FIG. 18) described above may include at least one or both of a diffusion sheet and prism sheet. As another example, the optical sheet (69 in FIG. 18) may be disposed on light source units 4 of the plurality of light emitting modules 100A, 100B, and 100C. Light emitted from the light source units 4 of the plurality of light emitting modules 100A, 100B and 100C is mixed to emit white light, is reflected from the reflective member 65, and may be mixed in a mixing space in the reflective member 65 and then exited to an outside through the optical sheet 69.

Light which can be emitted from the plurality of light emitting modules 100A, 100B, and 100C according to an embodiment is located between 2700K and 6500K as shown in FIG. 25 depending on a correlated color temperature (CCT). A CRI of light emitted from the light emitting modules 100A, 100B, and 100C according to an embodiment may be 88 or more, for example, the CRI may be 90 or more. If the CRI is greater than 90, the correlated color temperature of light which can be emitted from the light emitting modules 100A, 100B, and 100C according to an embodiment may be located between 2700K and 5700K.

The first light source unit 4A of a first light emitting module 100A may be driven by a first current signal $I_{R1}$ of a first driving unit 531 of a first driver 530A, the second light source unit 4B may be driven by a second current signal $I_{G1}$ of a second driving unit 532 of a first driver 530A, and the third light source unit 4C may be driven by a third current signal $I_{B1}$ of a third driving unit 533 of a first driver 530A. The first light emitting module 100A may drive the first to third light source units 4A, 4B and 4C by the first to third current signals $I_{G1}$, and $I_{B1}$ of the first driver 530A.

A second light emitting module 100B may drive first to third light source units 4A, 4B and 4C by first to third current signals $I_{R2}$, $I_{G2}$, and $I_{B2}$ of driving units 531, 532 and 533 of a second driver 530B. A third light emitting module 100C may drive first to third light source units 4A, 4B and 4C by first to third current signals $I_{R3}$, $I_{G3}$, and $I_{B3}$ of driving units 531, 532 and 533 of a third driver 530C.

The plurality of light emitting modules 100A, 100B, and 100C may emit white light having a CCT by the first to third light source units 4A, 4B, and 4C. Light emitted from the plurality of light emitting modules 100A, 100B, and 100C is sensed by an optical sensor 550, and the sensed optical information is transmitted to the control unit 510.

The heat sensing unit 5 senses temperatures of the individual light emitting modules 100A, 100B, and 100C and transmits the sensed temperature information to the control unit 510.

The control unit 510 controls driving of information transmitted from the optical sensor 550 and the heat sensing device 5 by referring to a lookup table 522 of the memory part 520. For example, the control unit 510 transmits the first to third current control signals $D_{R1-R3}$, $D_{G1-G3}$, and $D_{B1-B3}$ to first to third driving units 531, 532, and 533 of the first to third drivers 530A, 530B, and 530C so that white light emitted from a light source unit 4 of each of the first to third light emitting modules 100A, 100B and 100C may be white light having a predetermined CCT in the lookup table 522, by referring to information transmitted from the optical sensor 550 and the heat sensing unit 5.

The first to third current control signals $D_{R1-R3}$, $D_{G1-G3}$, and $D_{B1-B3}$ may be an intensity value of an input current to the first to third light source units 4A, 4B and 4C of the first to third light emitting modules 100A, 100B, and 100C so that white light having the CCT is emitted. The first to third current control signals $D_{R1-R3}$, $D_{G1-G3}$, and $D_{B1-B3}$ may be a pulse width modulation (PWM) signal, an amplitude modulation signal, or an analog-type signal. In an embodiment of the present invention, the description will be limited to the PWM signal.

The first to third driving units 531, 532, and 533 of the first to third drivers 530A, 530B, and 530C generate the first to third current control signals $D_{R1-R3}$, $D_{G1-G3}$, and $D_{B1-B3}$ of the control unit 510, for example, a driving current corresponding to a PWM signal, which are then output to the first to third light source units 4A, 4B and 4C of each of the light emitting modules 100A, 100B, and 100C. That is, the drivers 530A, 530B, and 530C generate drive currents having different current intensities for each time period in order to produce a natural light atmosphere during the morning, lunch, or evening.

The memory part 520 includes a lookup table 522 and luminous flux deviation data 523. The memory part 520 may be an electrically erasable programmable read-only memory (EEPROM), but the present invention is not limited thereto.

In the lookup table 522, intensity values of input currents of the first to third light source units 4A, 4B and 4C are stored so that white light having a predetermined CCT for each chromaticity of light sensed from the light emitting module 100A, 100B, and 100C is emitted. In the lookup table 522, intensity values of input currents of the first to third light source units 4A, 4B and 4C are stored so that white light having a predetermined CCT for each temperature sensed from the light emitting module 100A, 100B, and 100C is emitted. In the lookup table 522, an intensity value of an input current of a dimming signal is stored. An intensity value of the input current may be represented by a duty ratio, and the duty ratio represents a ratio of a high section to the pulse duration.

In the lookup table 522, a ratio of a reference current value corresponding to the CCT required depending on an operation mode or a user's selection is stored in advance. A ratio of the reference current values may be experiment data previously measured by a designer.

The luminous flux deviation data 523 stores data which can be output as luminous flux values having the same luminous flux value for each color of the light source unit (for example, red, green or blue LED) of different light emitting modules 100A, 100B and 100C. The same luminous flux value may be stored as a duty ratio at which the luminous flux value emitted from red, green or blue light emitting devices may be output as a reference luminous flux value.

For example, red light emitting devices included in the different light emitting modules 100A, 100B, and 100C may be controlled to a first luminous flux value, green light emitting devices may be controlled to a second luminous flux value, and blue light emitting devices may be controlled to a third luminous flux value.

The first luminous flux value may be set to a duty ratio which can compensate for the luminous flux deviation value of the red light emitting devices so that the luminous flux of the red light emitting devices of each of the light emitting modules 100A, 100B, and 100C becomes a reference luminous flux of red light. Likewise, the second luminous flux value may be set to the luminous flux deviation value of the green light emitting devices as a duty ratio. The third luminous flux value may be stored as the luminous flux deviation value of the blue light emitting devices as a duty ratio.

Accordingly, first to third luminous flux values emitted from the respective light emitting modules 100A, 100B, and 100C are measured and stored in advance, and thus first to third luminous flux values emitted from the different light emitting modules 100A, 100B and 100C can be realized with one color. Further, a color tone difference between the red light emitting devices emitted from the different light emitting modules 100A, 100B, and 100C, a color tone difference between the green light emitting devices, or the color tone difference between the blue light emitting devices can be eliminated.

In the embodiment, a deviation between a luminous flux value for each color of the plurality of light emitting modules 100A, 100B, and 100C and a reference luminous flux value is stored in the luminous flux deviation data 523, and a duty ratio that compensates the luminous flux deviation so that a reference luminous flux value for each color is output by the luminous flux deviation data 523 may be output when the light emitting modules 100A, 100B, and 100C are driven. For example, when a green light emitting device G1 of the first light emitting module is 140 lm, a green light emitting device G2 of the second light emitting module is 155 lm, and a green light emitting device G3 of the third light emitting module is 175 lm. In order to obtain difference data from the reference luminous flux value 180 lm, when an intensity of the input current of the first to third green light emitting devices G1, G2 and G3 is increased by 30%, 20%, and 5%, the luminous flux deviation data 523 may be stored as 30% for G1, 20% for G2, and 5% for G3. In addition, a duty ratio of the maximum current intensity at which 180 lm is derived from the luminous flux value of the first green light emitting device G1 having the lowest luminous flux value among the first to third green light emitting devices G1, G2, and G3, and then the duty ratio of the second to third green light emitting devices G2 and G3 is obtained.

In the lookup table 522, optical characteristics of each light emitting module, for example, an intensity value of an input current which can be chromaticity coordinates of white light of each of the light emitting modules 100A, 100B, and 100C as a reference for each CCT may be stored.

The control unit 510 outputs first to third current control signals $D_{R1-R3}$, $D_{G1-G3}$, and $D_{B1-B3}$ corresponding to intensity values of input currents of first to third light source units 4A, 4B, and 4C of the plurality of light emitting modules 100A, 100B and 100C to the drivers 530A, 530B, and 530C, by referring to the luminous flux deviation data 523 for each color of the module of the memory part 520.

In addition, the optical sensor 550 senses a luminous flux of white light emitted from the light emitting modules 100A, 100B, and 100C, and then transmits sensed luminous flux information to the control unit 510. The control unit 510 transmits first to third current control signals $D_{R1-R3}$, $D_{G1-G3}$, and $D_{B1-B3}$ to the drivers 530A, 530B, and 530C by compensating each duty ratio so that the measured luminous flux value may be a reference luminous flux.

As a temperature of white light emitted from the light emitting modules 100A, 100B, and 100C increases, the color coordinates may be shifted. Accordingly, the control unit 510 transmits the first to third current control signals $D_{R1-R3}$, $D_{G1-G3}$, and $D_{B1-B3}$ to the drivers 530A, 530B, and 530C after detecting a value of an input current depending on temperature data sensed by a heat sensing device 5 of the light emitting modules 100A, 100B, and 100C, by referring to the lookup table 522 of the memory part 520. Here, the controller 510 can control white light emitted from the light emitting modules 100A, 100B, and 100C by referring to the lookup table 522 depending on a shift of color coordinates depending on temperature.

FIG. 29 illustrates a lighting control method of a lighting apparatus with reference to FIG. 28. The luminous flux deviation data for each color of a plurality of light emitting modules according to an embodiment is obtained. For this, reference luminous fluxes for respective colors of different light emitting modules are set in step S11. For example, reference luminous fluxes of red, green, and blue light emitting devices of the different light emitting modules are respectively set.

When reference luminous fluxes for first to third light source units are set, an intensity value of an input current for the set reference luminous flux for each color is set to a maximum value in step S12. The maximum current value is a value including a current value and an error at which the reference luminous flux value can be output in consideration of the number of light emitting devices in a light emitting module, LED type, driving voltage, current characteristics, and the like as a value about 5% to 10% higher than the current intensity value for a reference luminous flux.

In addition, luminous flux values of the light emitting devices of the respective light source units for each light emitting module are measured using a maximum current value, and the measured luminous flux values are stored in step S13. Such measurement and storage may be sequentially performed for each light source unit, but the invention is not limited thereto.

The luminous flux measured from the light emitting devices of the individual light source units of the respective light emitting modules is compared with the reference luminous flux in step S14. At this point, when the measured luminous flux and the reference luminous flux are not the same, the duty ratio is to be adjusted in step S15. For example, an intensity value of an input current, which can be a reference luminous flux, may be adjusted so that the measured flux for each color is adjusted to be the reference flux.

When the measured luminous flux and the reference luminous flux are the same, the maximum duty ratio is to be set in step S16. The set duty ratio may be stored in the lighting flux deviation data 523.

When a module driving signal is input in step S17, light emitting devices of first to third light source units are driven by a duty ratio having the luminous flux value, respectively in step S18. When the light emitting module is initially driven, a control signal for controlling each light source unit for each light emitting module is output with the set duty ratio, and thus it is possible to control a luminous flux of each color emitted from a light emitting module to be a reference luminous flux. The luminous flux emitted from these different light emitting modules may be the same color. Further, luminous flux values for the respective colors of red, green, and blue light emitting devices may be controlled to the same luminous flux value. In addition, the problem of correcting the luminous flux at an initial stage of driving the light emitting module by resetting duty ratios in advance depending on the characteristics of the respective light emitting modules may be solved.

In an embodiment, different duty ratios on separate channels, rather than controlling one duty ratio for different colors of different light emitting modules may be controlled, and thus luminous flux values of respective colors of the different light emitting modules can be controlled to be the same value. Therefore, the luminous flux values of the respective colors emitted from the different light emitting modules can be realized to be the same value.

When a temperature is sensed from the heat sensing unit 5 in step S19, the control unit 510 calculates the deviation of the input current intensity value corresponding to the sensed temperature from the first coordinate values T1 or the third coordinate values T3 as shown in FIG. 27, by referring to the lookup table 522, and then the controller 510 compensates chromaticity data so that the input current value of the light emitting module 100 is shifted to reference white light for each CCT (M1 or M2 in FIG. 27) in step S20. The control unit 510 may control the white light emitted from the light emitting module 100 to be emitted as white light having a predetermined CCT value using the lookup table 522 depending on the temperature change.

Further, first to third light source units 4A, 4B, and 4C that emit red, green, and blue light are combined, and thus it can be confirmed that a white light capable of maintaining a CRI of 90 or more, preferably 95 can be realized. Further it can be confirmed that a white light having a CCT in the range of 3500 K to 6500 K can be realized.

When the optical sensor 550 senses light, the controller 510 checks a luminous flux change, and if there is the luminous flux change in step S21, the duty ratio is corrected, and the intensity value of the input current for each color is adjusted in step S22. The correction of the duty ratio depending on the variation of the luminous flux is to be compensated using a reset duty ratio.

The lighting apparatus according to an embodiment may set the luminous fluxes of the respective colors emitted from the different light emitting modules to the same value, thereby eliminating the color tone difference between the different light emitting modules.

The light emitting module and/or the lighting apparatus having the same according to the embodiments may include apparatuses such as indoor lamps, outdoor lamps, streetlamps, automobile lamps, headlamps or tail lamps of moving devices and indicator lamps.

The light emitting module and/or the lighting apparatus having the same according to the embodiments may be applied to display devices. The display devices may be provided as modules or units irradiating light in the rears of panels such as liquid crystal display panels.

Features, structures, effects and the like described in the embodiments are included in at least one embodiment of the present invention, and are not necessarily limited to only one embodiment. Furthermore, the features, structures, effects, and the like described in each embodiment may be combined or modified by those of ordinary skill in the art to which the embodiments belong. Therefore, it should be construed that contents related to such variations and applications are included in the scope of the present invention.

In addition, although embodiments have been mostly described above, they are only examples and do not limit the present invention and a person skilled in the art may appreciate that several variations and applications not presented above may be made without departing from the essential characteristics of the embodiments. For example, each of components described in detail in the embodiment may be implemented in a modifiable manner. Therefore, it should be construed that differences related to such variations and applications are included in the scope of the present invention defined in the appended claims.

INDUSTRIAL APPLICABILITY

Embodiments can improve the color uniformity of a light emitting module.

Embodiments can improve heat radiation efficiency of a light emitting module.

Embodiments can reduce a size of a circuit board and a light emitting module having a circuit board due to an optimal arrangement of light emitting devices emitting different colors.

The invention claimed is:

1. A lighting apparatus comprising:
a circuit board;
a plurality of light emitting modules disposed on the circuit board and including a light source unit having first to third light source units for emitting red, green, and blue light;
a reflective member;
a controller for providing a current control signal for each of the first to third light source units;
a driver for controlling currents of the first to third light source units by a current control signal of the controller; and
a memory part for storing luminous flux deviation data of each of the first to third light source units of the plurality of light emitting modules,
wherein the first light source unit includes a plurality of first light emitting devices emitting red light, the second light source unit includes a plurality of second light emitting devices emitting green light, the third light source unit includes a plurality of third light emitting devices emitting blue light, the controller controls the currents of the first, second, and third light source units of the plurality of light emitting modules, respectively, by the intensity value of the input current corresponding to the luminous flux deviation data,
wherein the luminous flux deviation data is luminous flux data for each respective color of red, green and blue and which is outputted as the same luminous flux value for each respective color in the light source unit of the plurality of light emitting modules,
wherein the first, second and third light source units are disposed inside a virtual circle,
wherein the reflective member is coupled to openings of the circuit board and contacts an upper surface of the circuit board,
wherein a height of the reflective member is greater than a diameter of the virtual circle, and
wherein the reflective member forms an acute angle with an upper surface of the circuit board.

2. The lighting apparatus of claim 1, wherein the memory part includes a lookup table in which intensity values of input currents are stored to compensate white light emitted from the first to third light source units to white light of a predetermined reference for each CCT depending on a temperature change.

3. The lighting apparatus of claim 2, further comprising an optical sensor for sensing light emitted from the plurality of light emitting modules.

4. The lighting apparatus of claim 3, wherein the controller senses a change in luminous flux of each of the light emitting modules sensed by the optical sensor and then corrects the luminous fluxes of the respective color modules of the respective light emitting modules to the same value, wherein the controller controls the first light emitting devices of the each of the light emitting modules by a first luminous flux value, the second light emitting devices of the each of the light emitting modules by a second luminous flux value, and the third light emitting devices of the each of the light emitting modules by a third luminous flux value,
wherein the first luminous flux value is set to a duty ratio which compensates for the luminous flux deviation value of the first light emitting devices so that the luminous flux of the first light emitting devices of each of the light emitting modules becomes a reference luminous flux of red light,
wherein the second luminous flux value is set to a duty ratio which compensates for the luminous flux deviation value of the second light emitting devices so that the luminous flux of the second light emitting devices of each of the light emitting modules becomes a reference luminous flux of green light, and
wherein the third luminous flux value is set to a duty ratio which compensates for the luminous flux deviation value of the third light emitting devices so that the luminous flux of the third light emitting devices of each of the light emitting modules becomes a reference luminous flux of blue light.

5. The lighting apparatus of claim 2, wherein the light emitting module includes a heat sensing unit disposed outside the first light emitting device, the controller transmits first to third current control signals to the driver at an intensity value of an input current of the lookup table depending on a temperature received from the heat sensing unit.

6. The lighting apparatus of claim 1, wherein the first to third light emitting devices are disposed on the circuit board, the plurality of first light emitting devices are disposed at peripheries of outer sides of the second and third light emitting devices, the plurality of second light emitting devices are disposed on opposite sides of the plurality of third light emitting devices, the plurality of first light emitting devices are connected in series, the plurality of second light emitting devices are connected in series, the plurality of third light emitting devices are connected in series, wherein the numbers of the first to third light emitting devices are different.

7. The lighting apparatus of claim 6, wherein the circuit board includes a first wiring part disposed under the plurality of first light emitting devices, a second wiring part disposed under the plurality of second light emitting devices, and a third wiring part disposed under the plurality of third light emitting devices,
wherein each of the first, second and third wiring parts includes a plurality of wirings, and
wherein each of the plurality of wirings of the first wiring part has an upper surface area greater than an upper surface area of each of the wirings of the second and third wiring parts.

8. The lighting apparatus of claim 7, further comprising a plurality of support protrusions disposed in the reflective member and protruding onto the first wiring part,
wherein the plurality of first light emitting devices are disposed adjacent to the second and third light emitting devices on the reflective member.

9. The lighting apparatus of claim 8, wherein the support protrusion includes a metal material, and at least one of the supporting protrusions protrudes from at least one of wirings of the first wiring part.

10. The lighting apparatus of claim 6, wherein each of the first to third light emitting devices emit light of different wavelengths.

11. The lighting apparatus of claim 6, wherein the plurality of first light emitting devices are included at a larger number than the number of second light emitting devices, and the plurality of second light emitting devices are included at a larger number than the number of third light emitting devices.

12. The lighting apparatus of claim 6, wherein the second light emitting device is included at a number equal to or greater than 200% of the number of third light emitting devices, and the first light emitting device is included at a number of at least 125% of the number of second light emitting devices.

13. The lighting apparatus of claim 1, wherein an output side of the plurality of first light emitting devices is connected to an input side of the plurality of second light emitting devices, and an output side of the plurality of second light emitting devices is connected to an input side of the plurality of third light emitting devices.

14. The lighting apparatus of claim 1, further comprising a light transmissive member on the reflective member.

15. The lighting apparatus of claim 1, wherein the reflective member has an upper diameter larger than a lower diameter, and the height of the reflective member is greater than the lower diameter.

16. A lighting apparatus comprising:
a circuit board;
a plurality of light emitting modules disposed on the circuit board and including a light source unit having first to third light source units for emitting red, green, and blue light;
a controller for providing a current control signal for each of the first to third light source units;
a driver for controlling currents of the first to third light source units by a current control signal of the controller;
a memory part for storing luminous flux deviation data of each of the first to third light source units of the plurality of light emitting modules;
a heat sensing unit disposed outside the first light emitting device;
an optical sensor for sensing light emitted from the plurality of light emitting modules; and
a reflective member disposed on the circuit board and disposed at a periphery of the light source unit,
wherein the first light source unit includes a plurality of first light emitting devices emitting red light,
wherein the second light source unit includes a plurality of second light emitting devices emitting green light,
wherein the third light source unit includes a plurality of third light emitting devices emitting blue light,
wherein the controller controls the currents of the first, second, and third light source units of the plurality of light emitting modules, respectively, by the intensity value of the input current corresponding to the luminous flux deviation data,
wherein the luminous flux deviation data is a luminous flux data of a respective color of red, green and blue emitted from each of the light emitting modules is a data for output as the same luminous flux value,
wherein the circuit board includes a plurality of support protrusions disposed in the reflective member and protruding onto a first wiring part which are disposed under the plurality of first light emitting devices,
wherein the plurality of first light emitting devices are disposed adjacent to the second and third light emitting devices on the reflective member,
wherein the controller senses a change in luminous flux of each of the light emitting modules sensed by the optical sensor and then corrects the luminous fluxes of the respective color modules of the respective light emitting modules to the same value,
wherein the first, second and third light source units are disposed inside a virtual circle,
wherein the reflective member is coupled to openings of the circuit board and contacts an upper surface of the circuit board,
wherein a height of the reflective member is greater than a diameter of the virtual circle, and
wherein the reflective member forms an acute angle with an upper surface of the circuit board.

17. The lighting apparatus of claim 16, wherein the support protrusion includes a metal material, and at least one of the supporting protrusions protrudes from at least one of wirings of the first wiring part.

* * * * *